United States Patent
Tsubaki

(10) Patent No.: US 9,337,180 B2
(45) Date of Patent: May 10, 2016

(54) SEMICONDUCTOR DEVICE AND MANUFACTURING METHOD OF SEMICONDUCTOR DEVICE

(71) Applicant: Renesas Electronics Corporation, Kawasaki-shi, Kanagawa (JP)

(72) Inventor: Shigeki Tsubaki, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 14/686,843

(22) Filed: Apr. 15, 2015

(65) Prior Publication Data

US 2015/0303182 A1    Oct. 22, 2015

(30) Foreign Application Priority Data

Apr. 18, 2014 (JP) ................. 2014-086893

(51) Int. Cl.
| | |
|---|---|
| H01L 27/02 | (2006.01) |
| H01L 27/06 | (2006.01) |
| H01L 29/06 | (2006.01) |
| H01L 29/861 | (2006.01) |
| H01L 29/66 | (2006.01) |
| H01L 21/84 | (2006.01) |
| H01L 27/12 | (2006.01) |

(52) U.S. Cl.
CPC ............ *H01L 27/0255* (2013.01); *H01L 21/84* (2013.01); *H01L 27/0629* (2013.01); *H01L 27/1203* (2013.01); *H01L 29/0649* (2013.01); *H01L 29/6609* (2013.01); *H01L 29/861* (2013.01)

(58) Field of Classification Search
CPC ............ H01L 21/8249; H01L 27/1203; H01L 21/8234; H01L 27/0266; H01L 27/0629; H01L 29/6609
See application file for complete search history.

(56) References Cited

U.S. PATENT DOCUMENTS

| | | | |
|---|---|---|---|
| 6,352,882 B1* | 3/2002 | Assaderaghi | H01L 21/84 257/E21.703 |
| 6,531,743 B1* | 3/2003 | Hirashita | H01L 21/84 257/354 |
| 2002/0053705 A1* | 5/2002 | Kondo | H01L 21/8249 257/368 |

FOREIGN PATENT DOCUMENTS

JP    2001-284579 A    10/2001

* cited by examiner

*Primary Examiner* — Mohsen Ahmadi
(74) *Attorney, Agent, or Firm* — Sughrue Mion, PLLC

(57) ABSTRACT

The semiconductor device of the present invention includes: a MOSFET having a gate electrode formed via a gate insulating film over a semiconductor layer and source and drain regions formed in the semiconductor layer on both sides of the gate electrode; and a diode. The diode has an n$^+$-type semiconductor region, a p-type semiconductor region and a p$^+$-type semiconductor region. Then, the gate electrode is connected to the n$^+$-type semiconductor region via an n-type semiconductor region formed so as to be connected to the n$^+$-type semiconductor region. Also, the p$^+$-type semiconductor region is connected to a semiconductor layer below the gate electrode. In this way, by providing the diode between the back gate and gate electrode of the MOSFET, breakage of the gate insulating film can be prevented.

18 Claims, 32 Drawing Sheets

(A)

(B)

(C)

FIG. 6
(A)
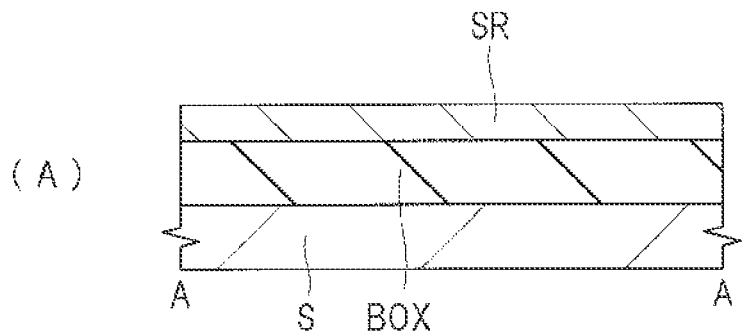
(B)
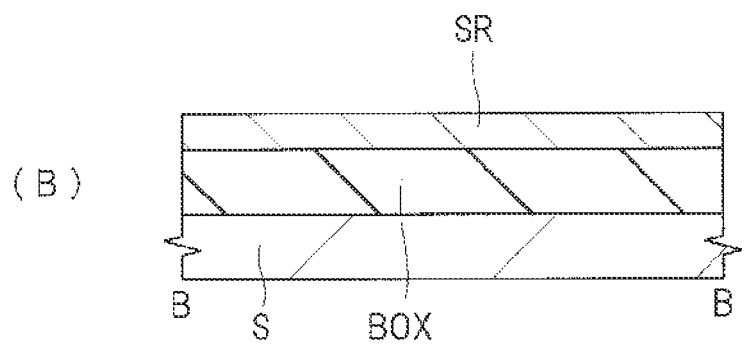
(C)
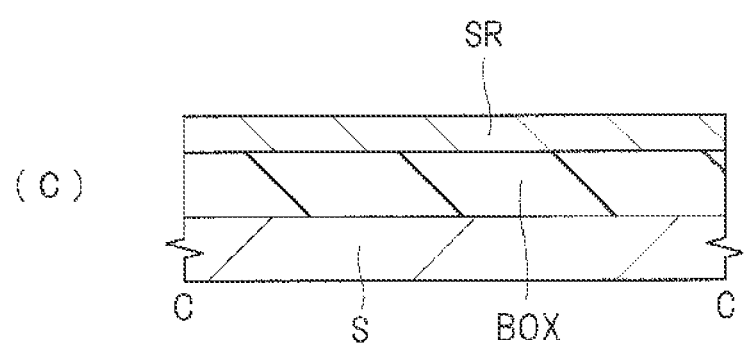

FIG. 7
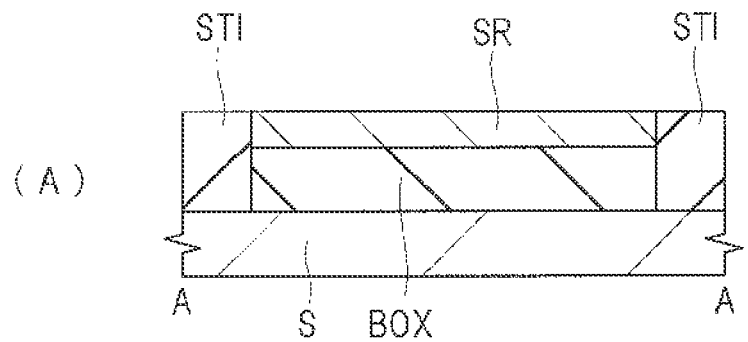
(A)
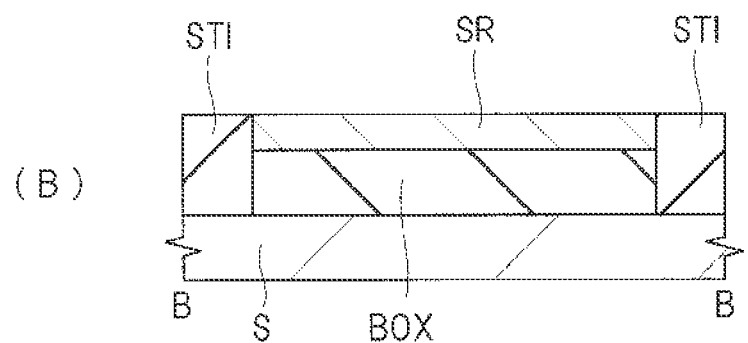
(B)
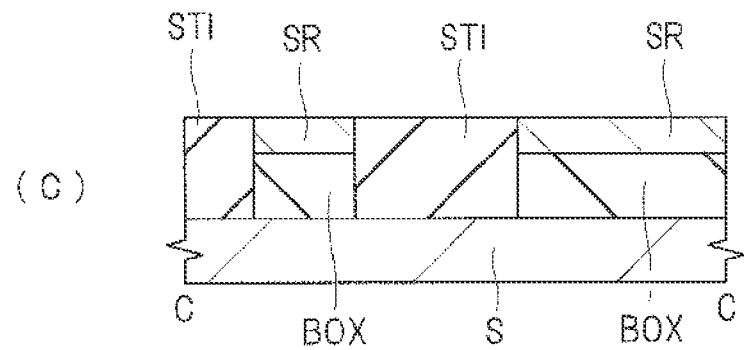
(C)

FIG. 9
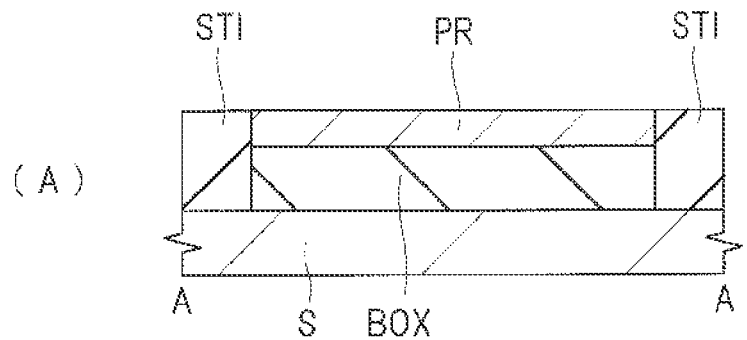
(A)
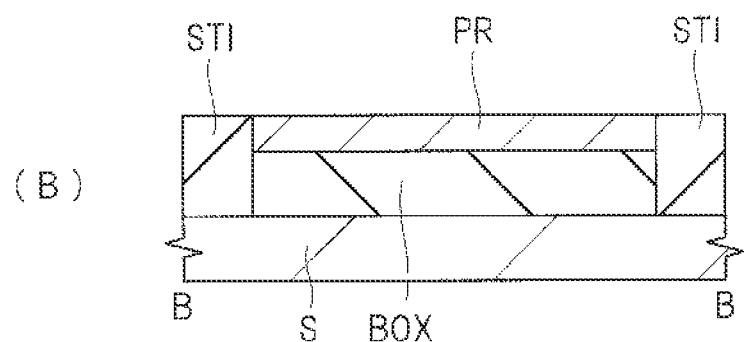
(B)
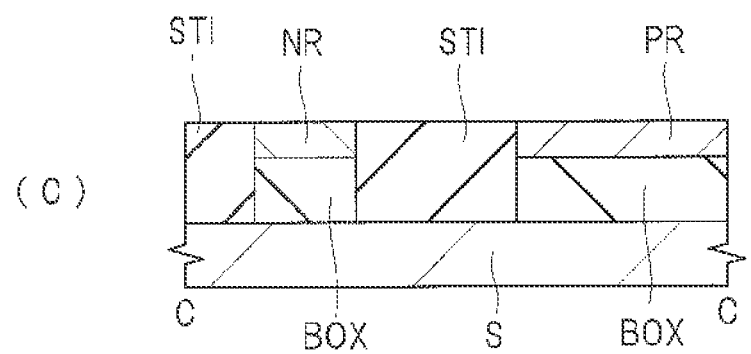
(C)

FIG. 11
(A)
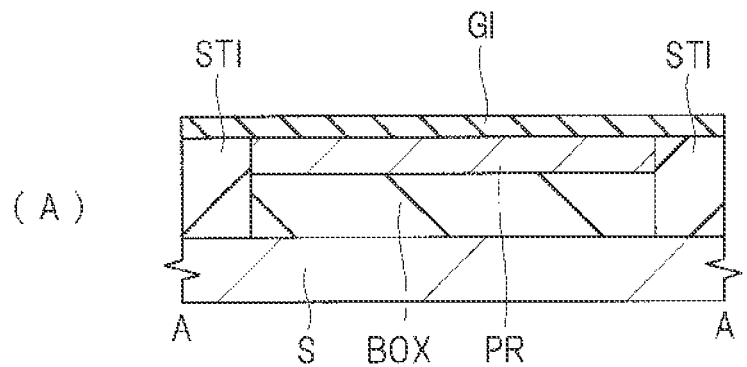
(B)
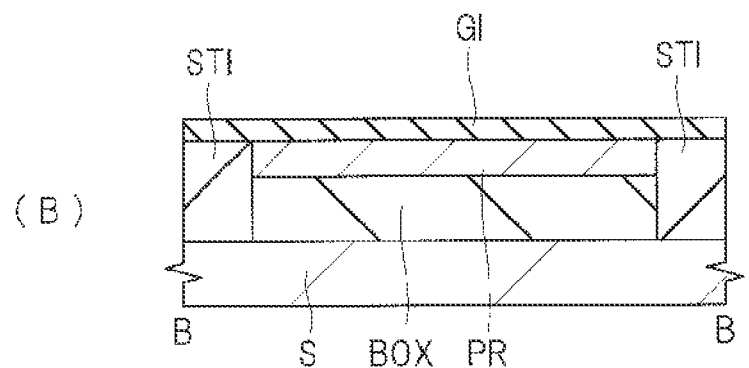
(C)
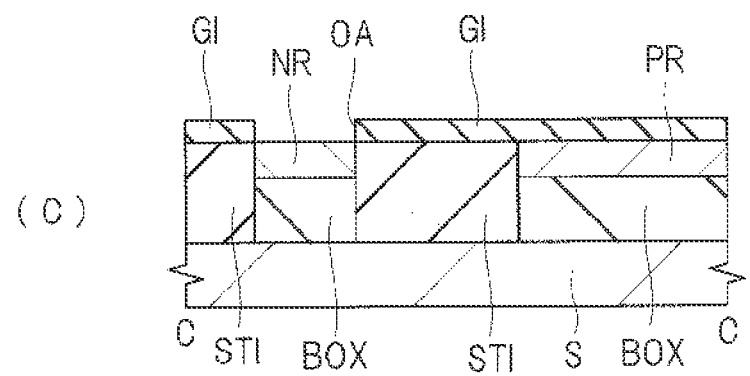

FIG. 14
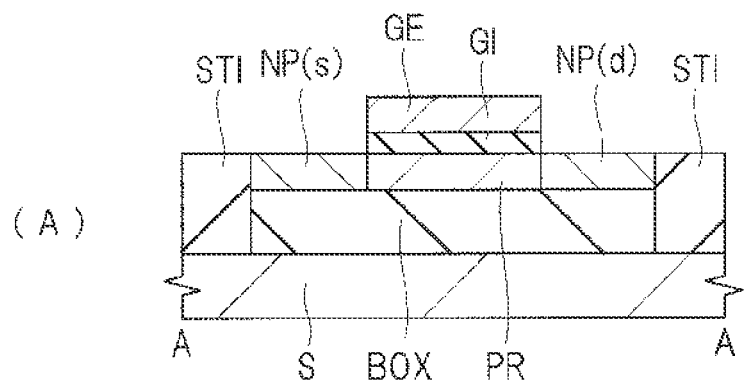
(A)
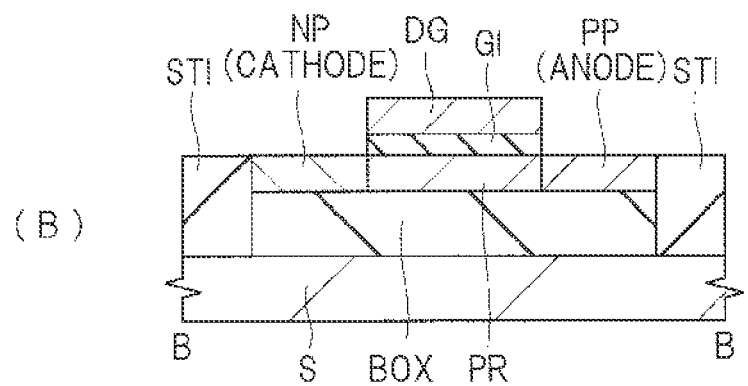
(B)
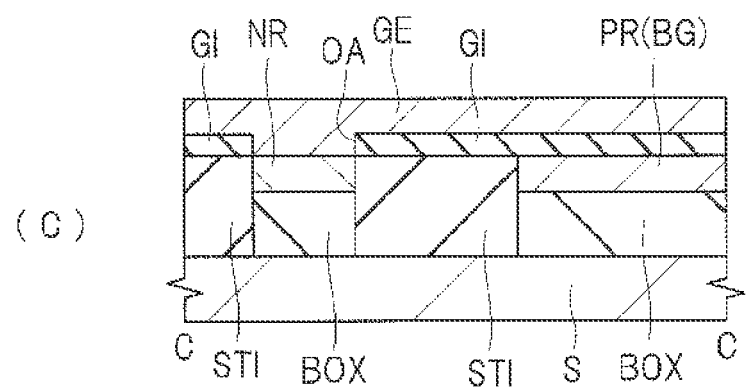
(C)

FIG. 15
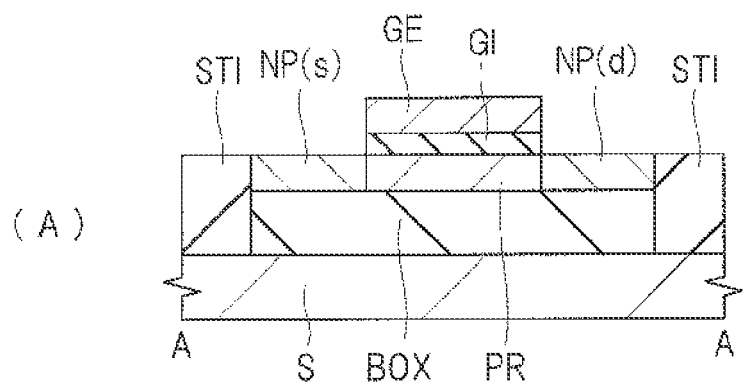
(A)
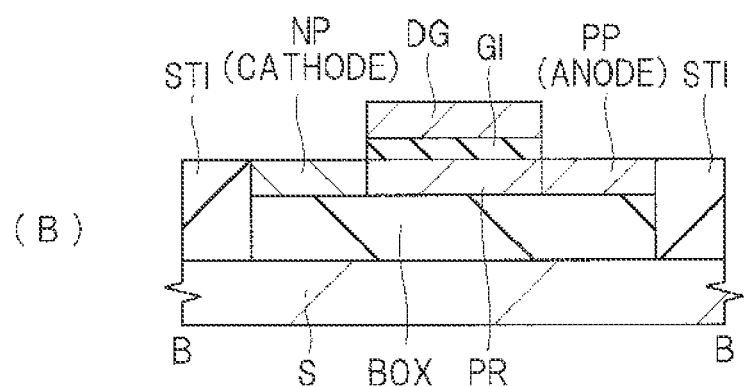
(B)
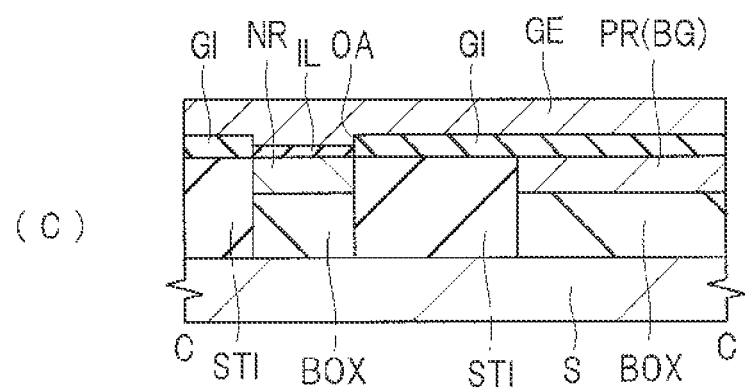
(C)

FIG. 18
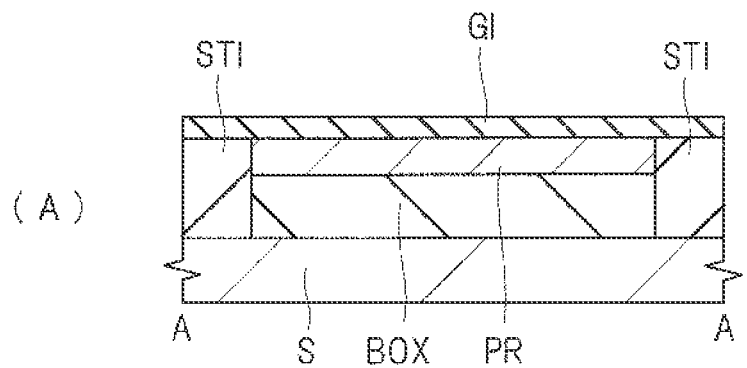
(A)
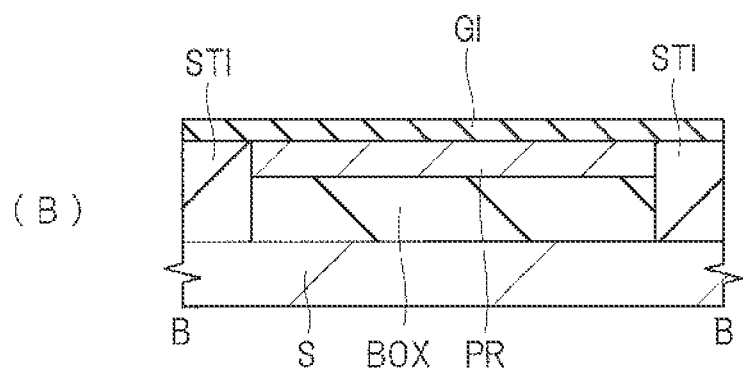
(B)
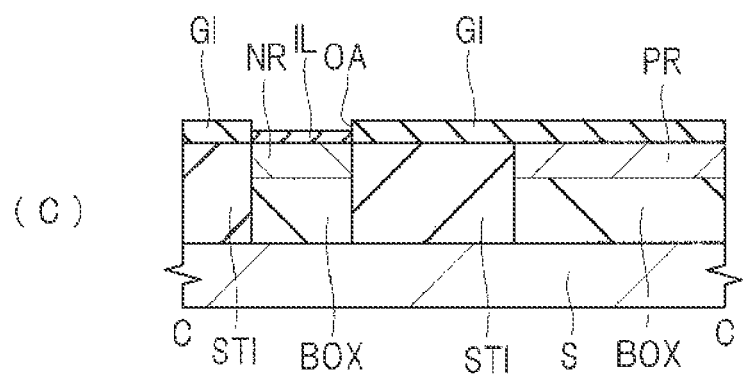
(C)

FIG. 19
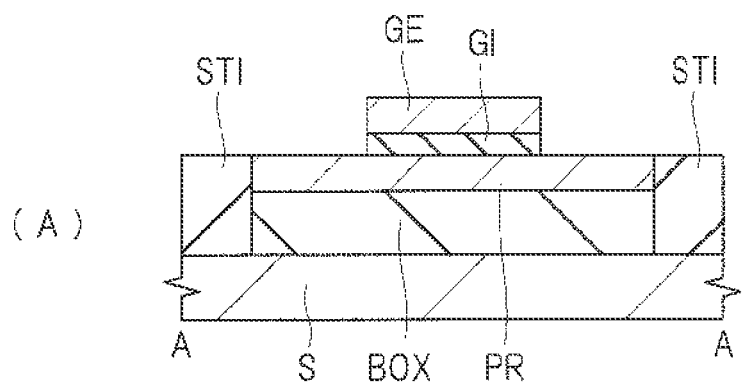
(A)
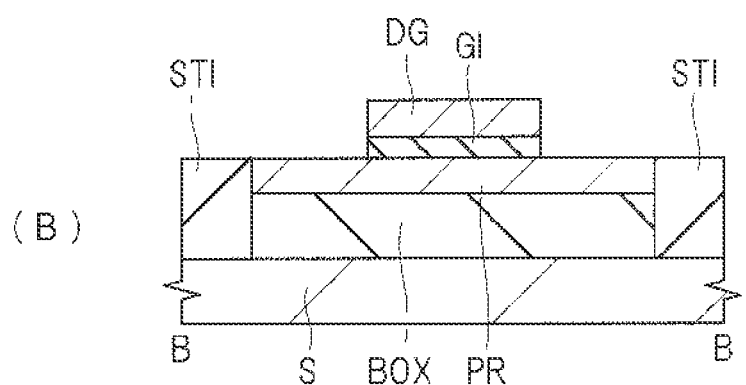
(B)
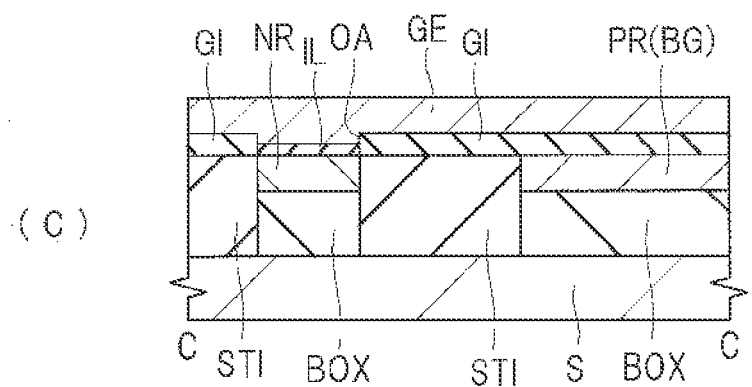
(C)

FIG. 20
(A) 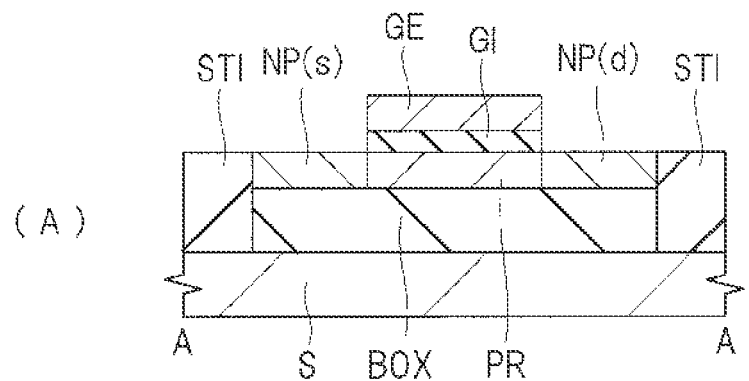
(B) 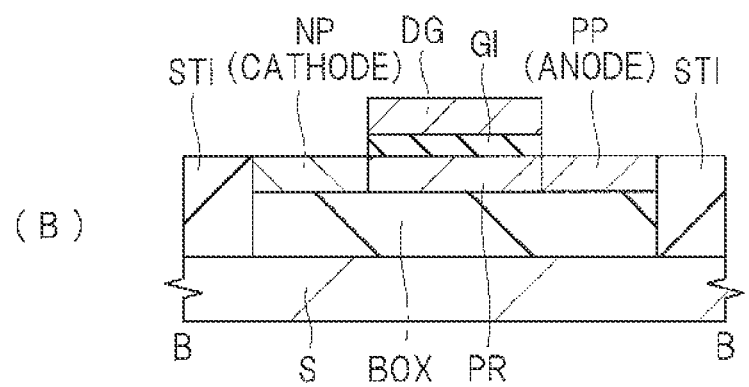
(C) 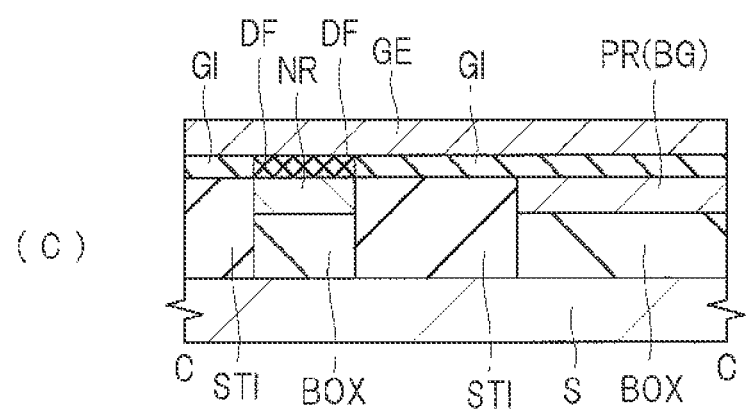

FIG. 22
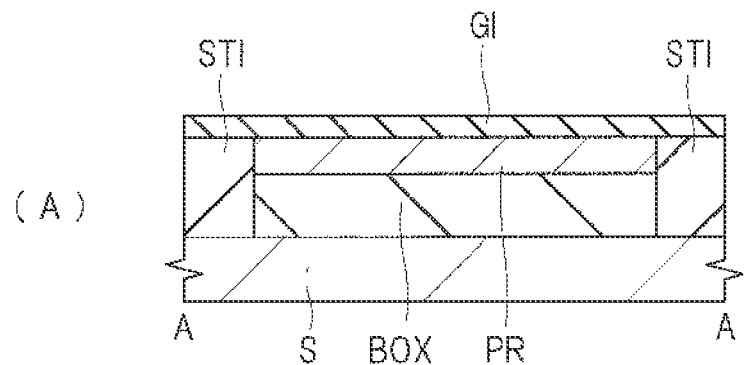
(A)
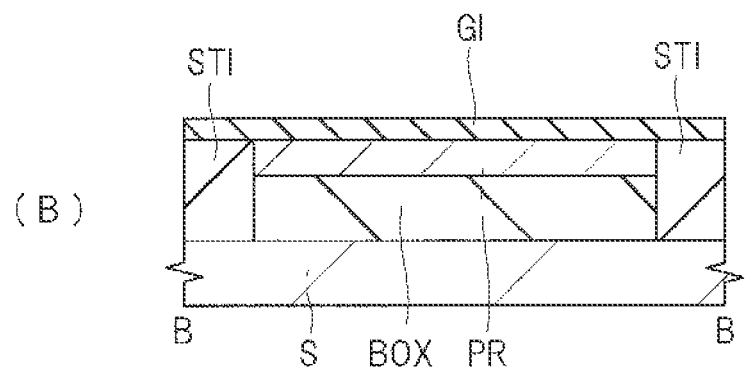
(B)
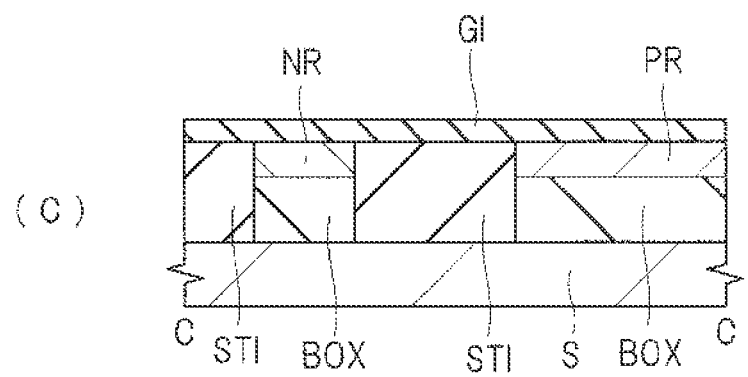
(C)

FIG. 23
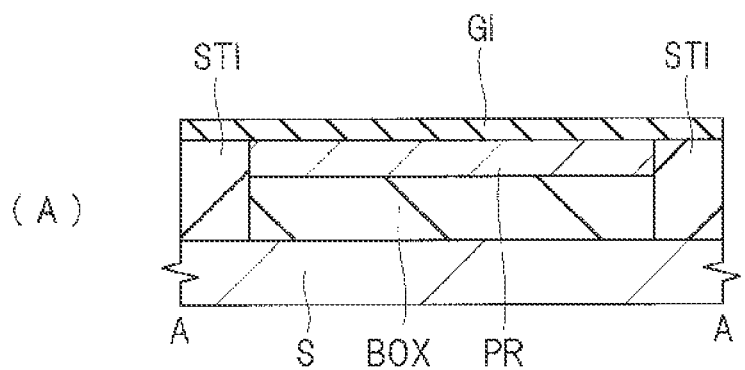
(A)
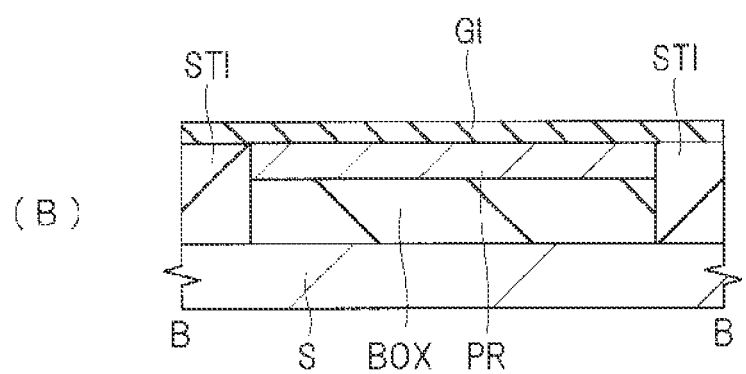
(B)
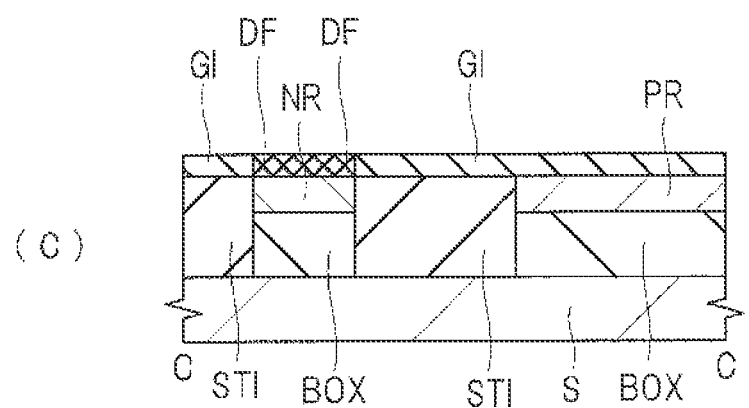
(C)

FIG. 24
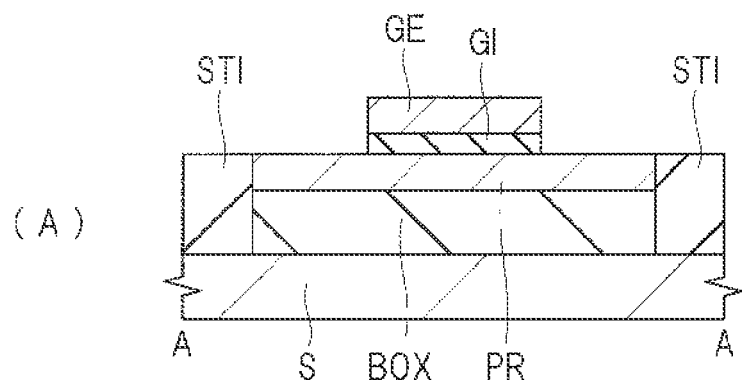
(A)
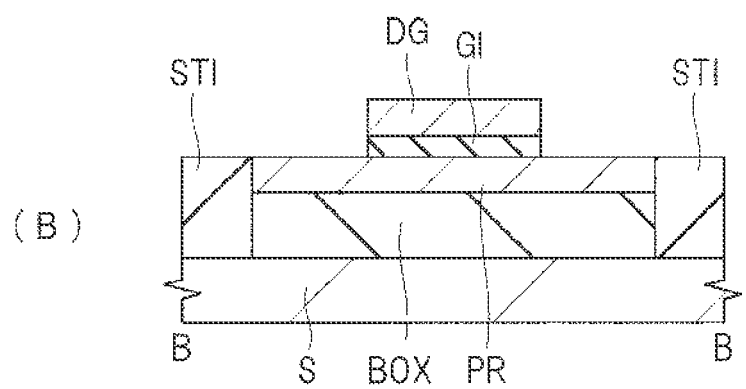
(B)
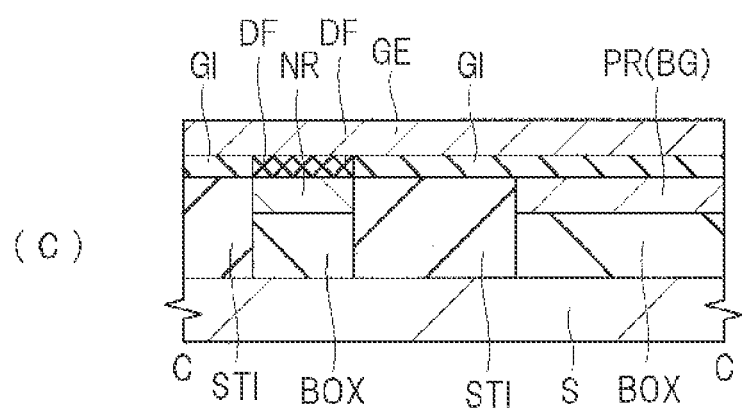
(C)

FIG. 25
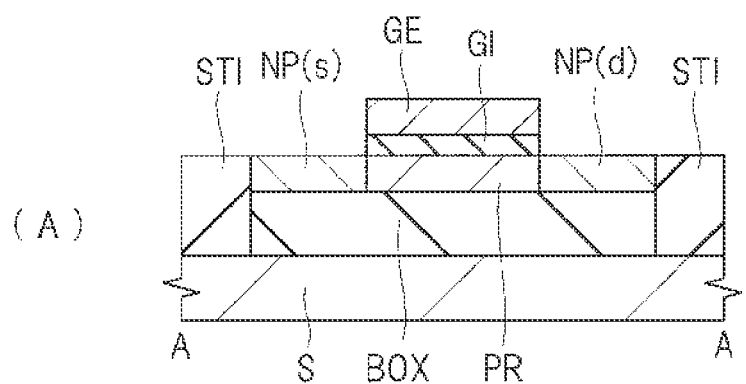
(A)
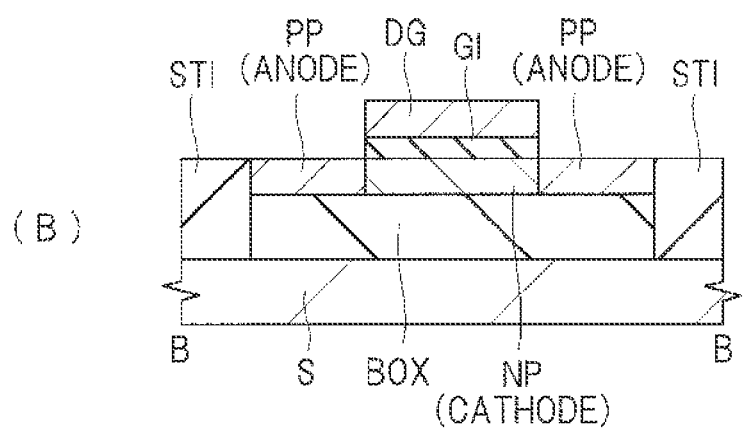
(B)
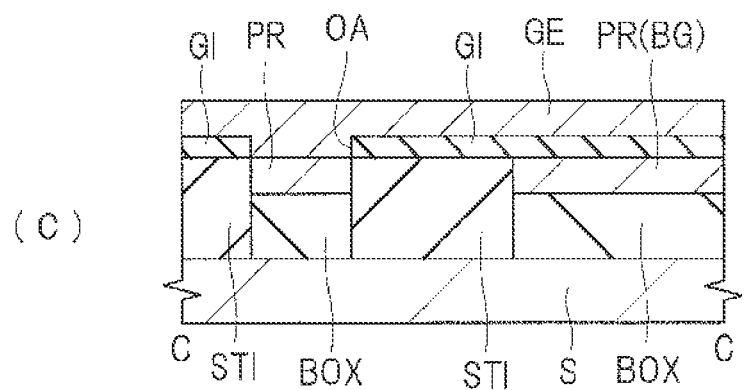
(C)

FIG. 28
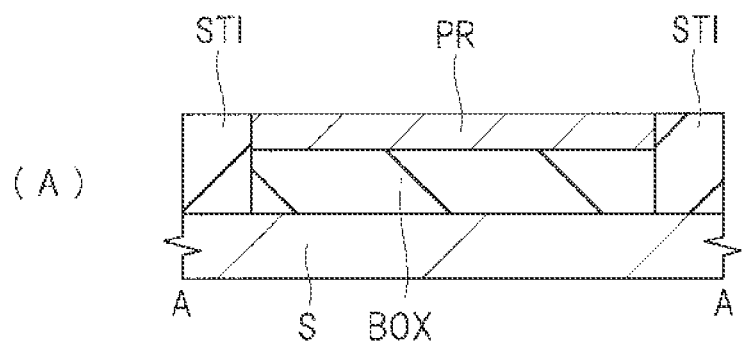
(A)
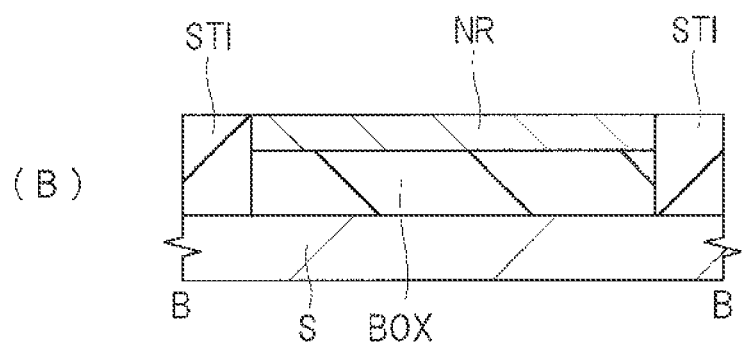
(B)
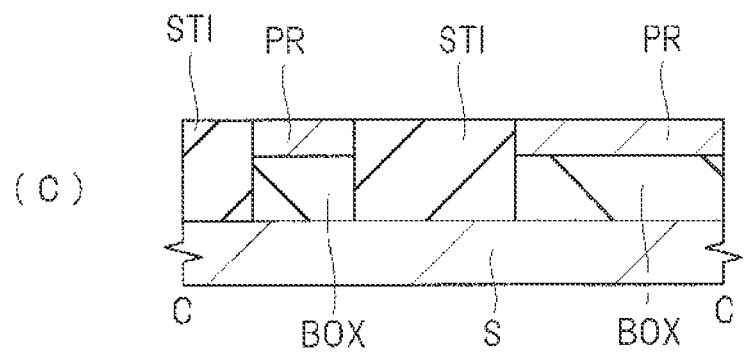
(C)

FIG. 30
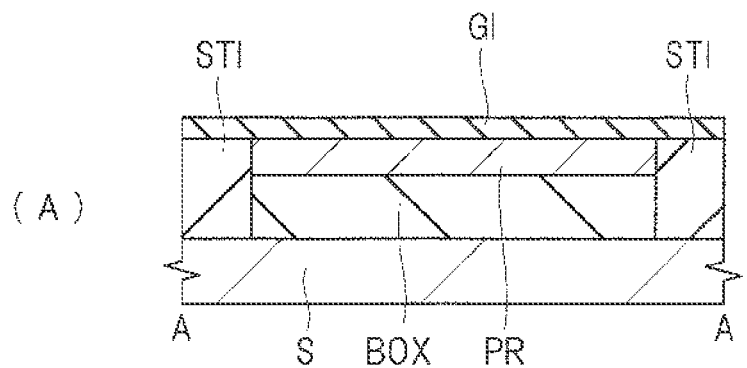
(A)
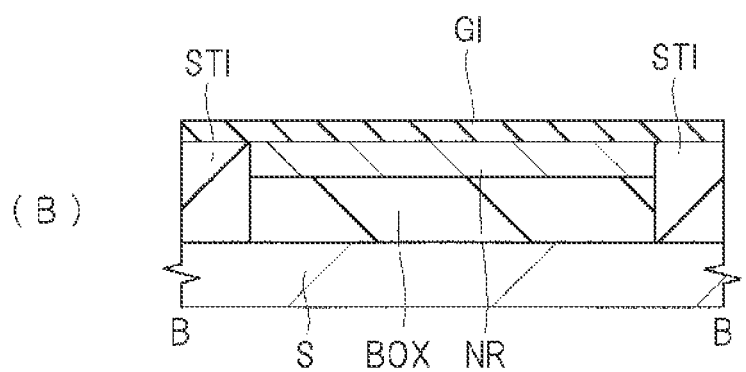
(B)
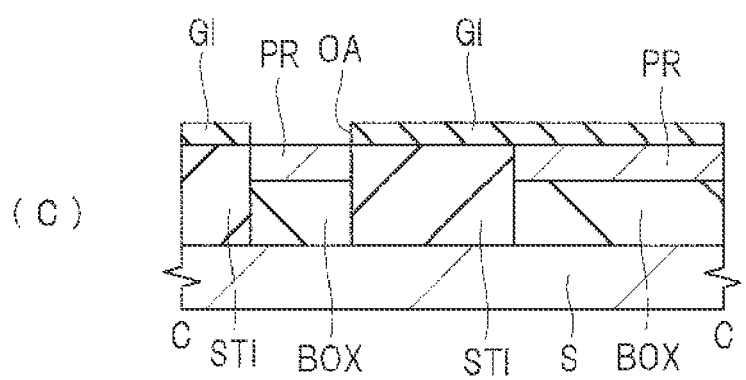
(C)

FIG. 31
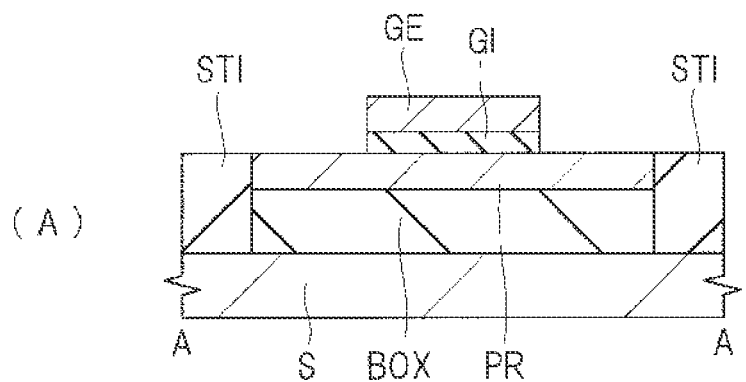
(A)
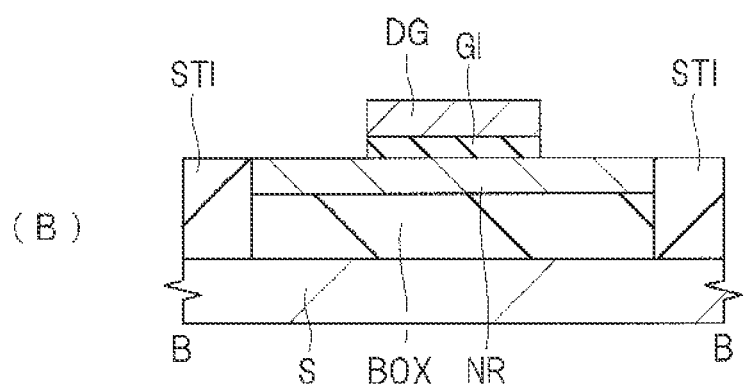
(B)
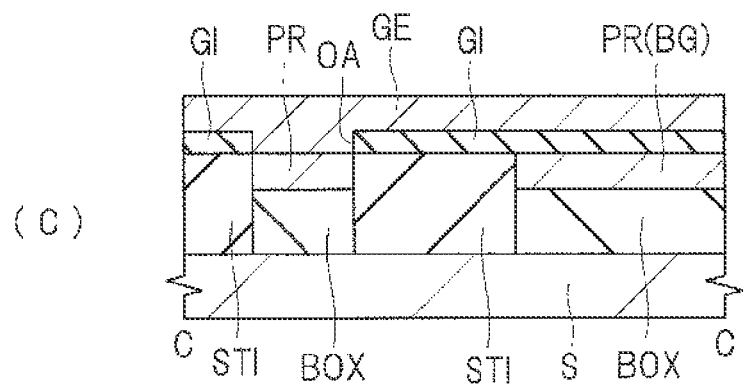
(C)

FIG. 32
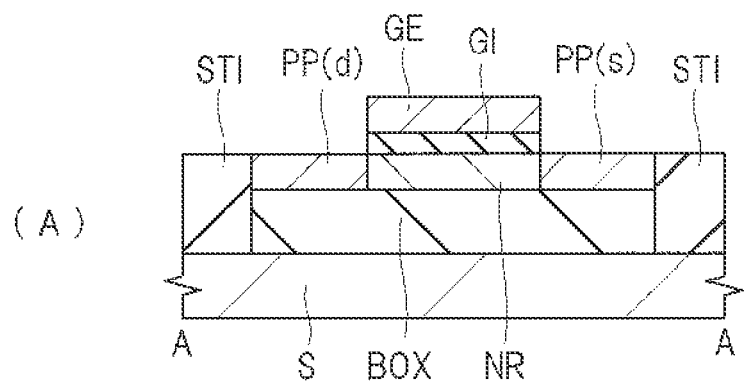
(A)
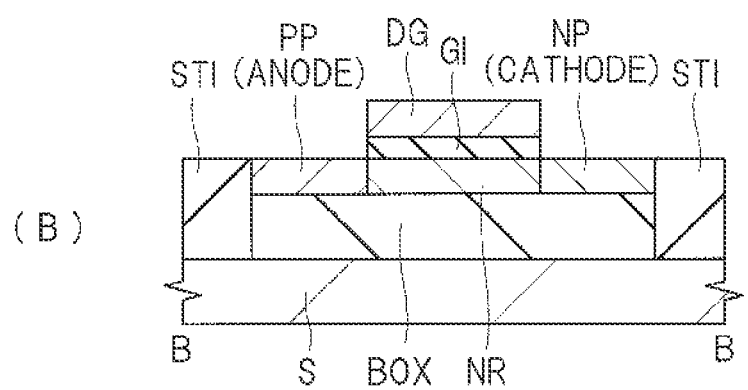
(B)
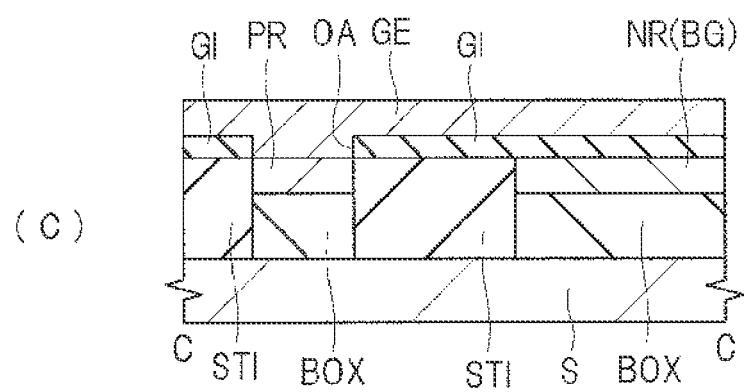
(C)

FIG. 34
(A) 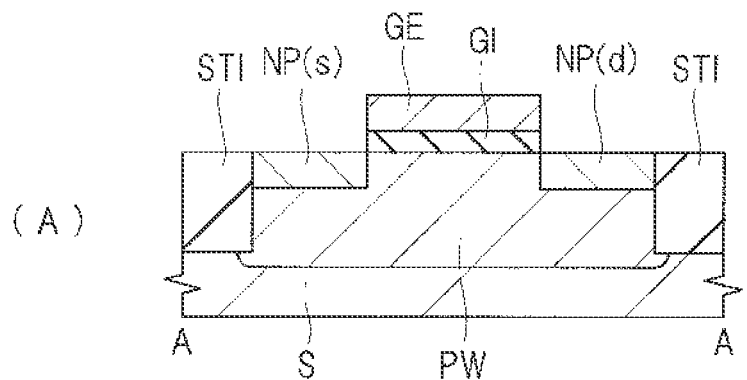
(B) 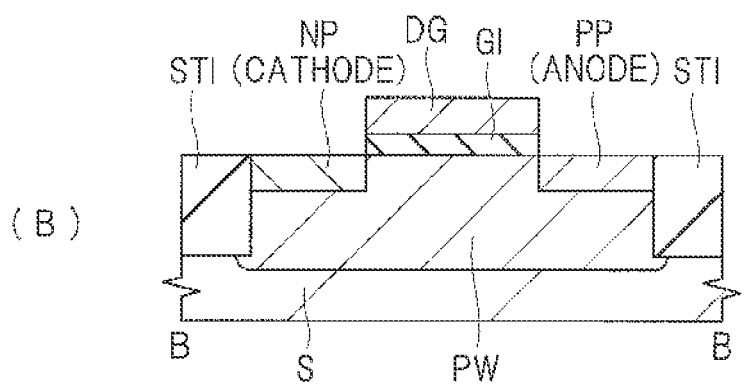
(C) 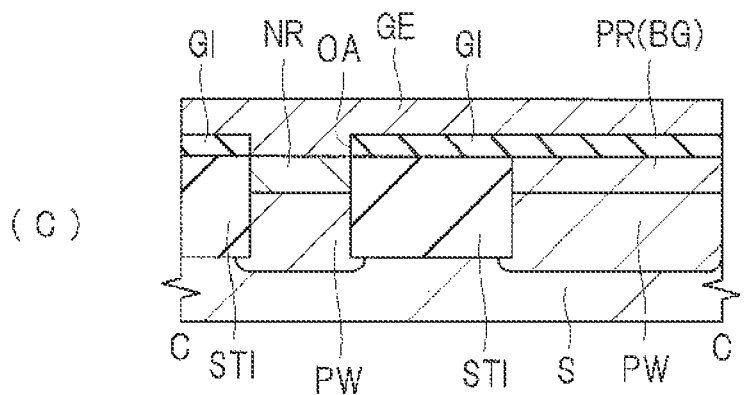

SEMICONDUCTOR DEVICE AND MANUFACTURING METHOD OF SEMICONDUCTOR DEVICE

CROSS-REFERENCE TO RELATED APPLICATION

The present application claims priority from Japanese Patent Application No. 2014-086893 filed on Apr. 18, 2014, the content of which is hereby incorporated by reference into this application.

TECHNICAL FIELD OF THE INVENTION

The present invention relates to a semiconductor device and can be suitably used in particular for a semiconductor device having a MOSFET.

BACKGROUND OF THE INVENTION

A MOSFET has a gate electrode formed via a gate insulating film over a semiconductor substrate and source and drain regions formed in the semiconductor substrate on both sides of the gate electrode. Improvement in characteristics of such a MOSFET has been studied. Also, in order to achieve performance enhancement such as reduction of power consumption and higher speed of the semiconductor device having such a MOSFET, adoption of a SOI (Silicon On Insulator) substrate has been studied.

For example, Japanese Patent Application Laid-Open Publication No. 2001-284579 (Patent Document 1) discloses a technique for protecting a MOSFET from plasma by a protective diode. In addition, it discloses a technique for effectively protecting a MOSFET from plasma generated during the manufacture of the MOSFET by connecting a MOS capacitor having a dielectric breakdown voltage lower than that of the MOSFET to a gate of the MOSFET.

SUMMARY OF THE INVENTION

The inventor of the present invention has been engaged in research and development of the semiconductor device having the MOSFET as mentioned above, and has earnestly studied the improvement in characteristics thereof. In the process, it has become clear that there is a room for the further improvement with respect to the characteristics of a semiconductor device having a MOSFET.

The other objects and novel characteristics of the present invention will be apparent from the description of the present specification and the accompanying drawings.

The following is a brief description of an outline of the typical invention disclosed in the present application.

A semiconductor device described in an embodiment disclosed in the present application includes a MOSFET having a first electrode formed via a first insulating film over a semiconductor layer and source and drain regions of a first conductivity type which are formed in a semiconductor region of both sides of the first electrode, and a diode. The diode has a first semiconductor region of the first conductivity type and a second semiconductor region of a second conductivity type which is formed so as to have a PN junction with the first semiconductor region. Also, the first electrode is connected to the first semiconductor region via a third semiconductor region of the first conductivity type formed so as to be connected to the first semiconductor region. In addition, the second semiconductor region is connected to a semiconductor layer below the first electrode.

A manufacturing method of a semiconductor device described in an embodiment disclosed in the present application includes a step of forming a first semiconductor region, a step of forming a first insulating film, a step of removing the first insulating film over the first semiconductor region, thereby forming an opening, and a step of forming a first electrode extending from the first insulating film to an upper part of the opening.

According to the semiconductor device described in the following typical embodiments disclosed in the present application, characteristics of the semiconductor device can be enhanced.

According to the manufacturing method of a semiconductor device described in the following typical embodiments disclosed in the present application, the semiconductor device having excellent characteristics can be manufactured.

BRIEF DESCRIPTIONS OF THE DRAWINGS

FIG. 6 is a sectional view illustrating the manufacturing process of the semiconductor device of the first embodiment;

FIG. 7 is a sectional view illustrating the manufacturing process of the semiconductor device of the first embodiment;

FIG. 9 is a sectional view illustrating the manufacturing process of the semiconductor device of the first embodiment;

FIG. 11 is a sectional view illustrating the manufacturing process of the semiconductor device of the first embodiment;

FIG. 14 is a sectional view illustrating the manufacturing process of the semiconductor device of the first embodiment;

FIG. 15 is a sectional view illustrating a configuration of a semiconductor device (nMOS) of the second embodiment;

FIG. 18 is a sectional view illustrating the manufacturing process of the semiconductor device of the second embodiment;

FIG. 19 is a sectional view illustrating the manufacturing process of the semiconductor device of the second embodiment;

FIG. 20 is a sectional view illustrating a configuration of a semiconductor device (nMOS) of the third embodiment;

FIG. 22 is a sectional view illustrating the manufacturing process of the semiconductor device of the third embodiment;

FIG. 23 is a sectional view illustrating the manufacturing process of the semiconductor device of the third embodiment;

FIG. 24 is a sectional view illustrating the manufacturing process of the semiconductor device of the third embodiment;

FIG. 25 is a sectional view illustrating a configuration of a semiconductor device (nMOS) of the fourth embodiment;

FIG. 28 is a sectional view illustrating the manufacturing process of the semiconductor device of the fourth embodiment;

FIG. 30 is a sectional view illustrating the manufacturing process of the semiconductor device of the fourth embodiment;

FIG. 31 is a sectional view illustrating the manufacturing process of the semiconductor device of the fourth embodiment;

FIG. 32 is a sectional view illustrating a configuration of a semiconductor device (pMOS) of the fifth embodiment;

FIG. 34 is a sectional view illustrating a configuration of a semiconductor device (nMOS) of the sixth embodiment;

DESCRIPTIONS OF THE PREFERRED EMBODIMENTS

Figure 1:
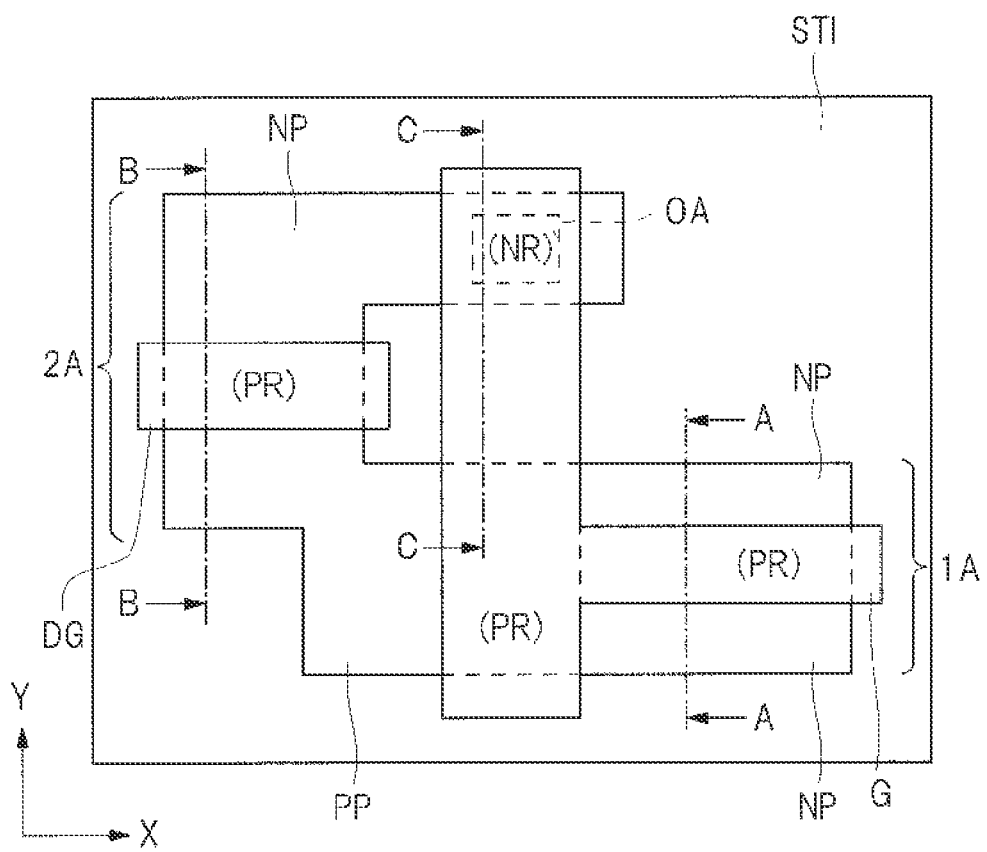
FIG. 1 is a plan view illustrating a configuration of a semiconductor device (n-channel type MOS) of the first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numbers and others described above (including number of pieces, values, amount, range, and the like).

Hereinafter, embodiments of the present invention will be described in detail with reference to the accompanying drawings. Note that components having the same function are denoted by the same or related reference characters throughout the drawings for describing the embodiments, and the repetitive description thereof will be omitted. Also, when there are a plurality of similar members (components), an individual or specific component is indicated by adding a sign to a generic symbol in some cases. In addition, the description of the same or similar portions is not repeated in principle unless particularly required in the following embodiments.

In some drawings used in the following embodiments, hatching is omitted even in a sectional view so as to make the drawings easy to see. Also, hatching is used even in a plan view so as to make the drawings easy to see.

Further, the size of respective members does not correspond to that of an actual device in sectional views and plan views, and a specific member is shown in a relatively enlarged manner in some cases so as to make the drawings easy to see. In addition, even when a plan view and a sectional view correspond to each other, the sizes of the members shown in the plan view and the sectional view may be different from each other.

First Embodiment

A semiconductor device of the present embodiment has an n-channel type MOSFET (Metal Oxide Semiconductor Field Effect Transistor). The MOSFET is referred to as a MISFET (Metal Insulator Semiconductor Field Effect Transistor) in some cases.

[Description of Structure]

Figure 2:
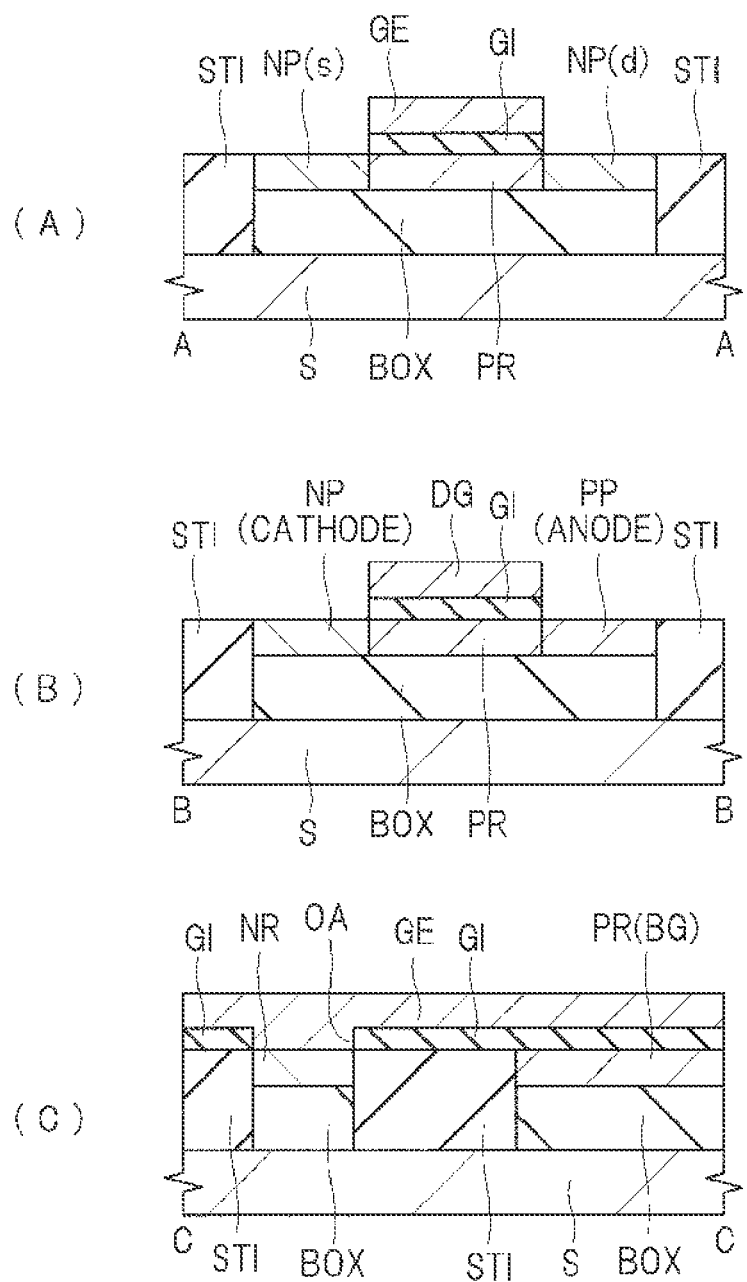
FIG. 2 is a sectional view illustrating the configuration of the semiconductor device (n-channel type MOS) of the first embodiment.

FIG. 1 is a plan view illustrating a configuration of a semiconductor device (n-channel type MOS) of the present embodiment, and FIG. 2 is a sectional view thereof. In FIG. 2, (A) corresponds to an A-A section of FIG. 1, (B) corresponds to a B-B section of FIG. 1, and (C) corresponds to a C-C section of FIG. 1.

As illustrated in FIG. 1, the n-channel type MOS (hereinafter, simply referred to as "nMOS") of the present embodiment is formed over a main surface of a semiconductor region (semiconductor layer, SR) constituting a SOI substrate. More specifically, as illustrated in FIG. 1, the n-channel type MOS is disposed in an active region (element formation region) made up of a semiconductor region (semiconductor layer, SR) surrounded by an element isolation region STI (see FIG. 7).

The SOI substrate has a supporting substrate S, an insulating layer BOX and a semiconductor region (semiconductor layer, SR) thereon (see FIG. 6). The supporting substrate S is, for example, a p-type single crystal silicon substrate.

Figure 8:
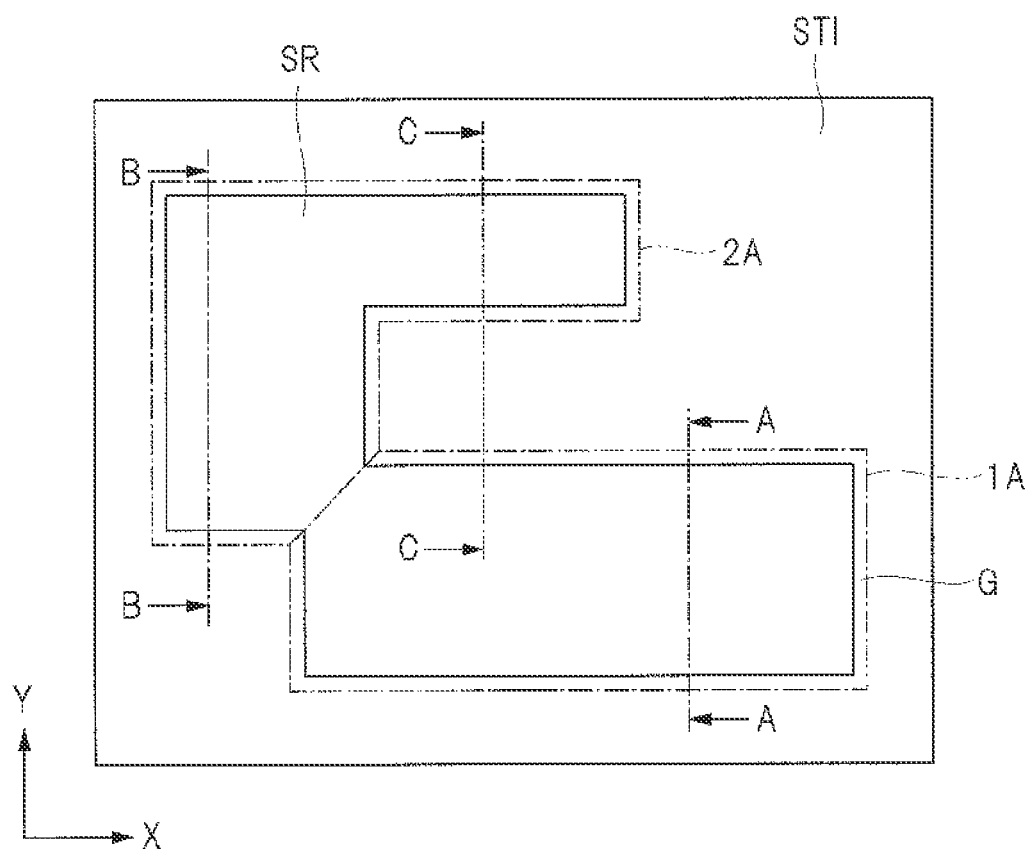
FIG. 8 is a plan view illustrating the manufacturing process of the semiconductor device of the first embodiment.

Here, the active region has a region 1A extending in an X direction and a region 2A extending in a Y direction from an end part of the region 1A (left side in FIG. 1) (see FIG. 8). The region 2A has a wide portion (projecting part) at an end part thereof (upper side in FIG. 1). Here, an nMOS is mainly formed in the region 1A and a protective diode (lateral diode) of the nMOS is mainly formed in the region 2A. Note that the above-mentioned wide portion in the region 2A serves as a connection part between the diode and a gate electrode GE of the nMOS.

As illustrated in FIG. 2(A), this nMOS has a gate electrode GE disposed via a gate insulating film GI over a p-type semiconductor region PR (semiconductor region SR) and source and drain regions (s and d) which are disposed in the semiconductor region (semiconductor layer, SR) on both sides of the gate electrode GE. The source and drain regions are made up of n$^+$-type semiconductor regions NP, and the region on the left side in the figure is the source region (s) and the region on the right side in the figure is the drain region (d) in the illustration of (A) of FIG. 2.

In addition, as illustrated in (B) of FIG. 2, the diode has an n$^+$-type semiconductor region (n$^+$-type diffusion layer) NP, a p-type semiconductor region PR and a p$^+$-type semiconductor region (p$^+$-type diffusion layer) PP. The p-type semiconductor region PR is provided between the n$^+$-type semiconductor region NP and the p$^+$-type semiconductor region PP. When the diode operates, the n$^+$-type semiconductor region NP serves as a cathode, and the p$^+$-type semiconductor region PP serves as an anode. An impurity concentration of the p-type semiconductor region (p-type diffusion layer) PR is lower than an impurity concentration of the p$^+$-type semiconductor region PP. In addition, the n$^+$-type semiconductor region NP is provided so as to be in contact with an n-type semiconductor region (n-type diffusion layer) NR described later. An impurity concentration of the n-type semiconductor region (n-type diffusion layer) NR is lower than an impurity concentration of the n$^+$-type semiconductor region NP.

Then, over the above-mentioned p-type semiconductor region PR, a dummy gate electrode DG disposed via the gate insulating film GI is provided. The dummy gate electrode DG is formed of the same layer as the gate electrode GE. The dummy gate electrode DG is not involved in the operation of the nMOS. Namely, no gate potential is applied to the dummy gate electrode DG, and the dummy gate electrode DG is maintained in, for example, a floating state. In addition, the dummy gate electrode DG may be electrically connected (fixed) to the cathode (n$^+$-type semiconductor region NP) and the anode (p$^+$-type semiconductor region PP) of the diode. The n$^+$-type semiconductor region NP and p$^+$-type semiconductor region PP are provided on both sides of this dummy gate electrode DG.

In this way, the diode is formed by a PN junction of the n$^+$-type semiconductor region (n$^+$-type diffusion layer) NP on the cathode side and the p-type semiconductor region PR and the p$^+$-type semiconductor region (p$^+$-type diffusion layer) PP on the anode side.

In addition, as illustrated in (C) of FIG. 2, the p-type semiconductor region PR (semiconductor region SR) below the gate electrode GE, that is, a back gate is connected to one end (p$^+$-type semiconductor region PP) of the diode. Also, the gate electrode GE is connected via an opening OA to the n-type semiconductor region NR linked to the other end (n$^+$-type semiconductor region NP) of the diode.

Figure 3:
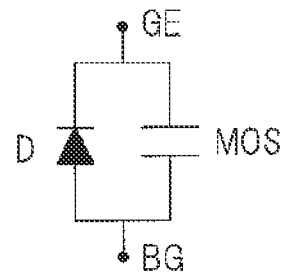
FIG. 3 is a circuit diagram schematically illustrating the configuration of the semiconductor device (nMOS) of the first embodiment.

FIG. 3 is a circuit diagram schematically illustrating the configuration of the semiconductor device (nMOS) of the present embodiment. As illustrated in FIG. 3, a diode D is provided between the back gate and the gate electrode GE of the nMOS. In FIG. 3, a configuration part of the gate electrode, the gate insulating film and the p-type semiconductor region PR (back gate) of the nMOS is illustrated as a capacitor (capacitance).

In this way, by providing a diode between the back gate and the gate electrode GE of the nMOS, the breakage of the gate insulating film GI of the nMOS can be prevented. For example, even when an undesirable charge is applied to the gate electrode GE and the p-type semiconductor region PR (back gate BG) of the nMOS, the breakage of the gate insulating film can be prevented. In particular, in a manufacturing process of a semiconductor device described later, a charge tends to be accumulated in a substrate in the process under a plasma atmosphere, for example, an etching process and an ashing process. Furthermore, when the SOI substrate is used, the region 1A (p-type semiconductor region PR, semiconductor region SR) in which the nMOS is formed is surrounded by the element isolation region STI and insulating layer BOX and comes to be in a completely isolated floating state (see FIG. 7). Therefore, there is no place for the charge to escape, and the charge tends to be accumulated. The charge like this often causes the breakage of the gate insulating film. In particular, in the manufacturing process, a designed protecting function does not work because a circuit function has not been completed, and a product yield is decreased due to the breakage of the gate insulating film. Meanwhile, in the present embodiment, since the diode is provided between the back gate and the gate electrode GE of the nMOS as mentioned above, the breakage of the gate insulating film can be prevented. Specifically, when a positive charge enters the gate electrode of the nMOS, a reverse breakdown voltage of the diode is broken down at a voltage lower than a dielectric breakdown voltage of the gate insulating film, so that an electric potential between the gate electrode and the back gate of the nMOS can be prevented from exceeding the dielectric breakdown voltage of the gate insulating film, and the breakage of the gate insulating film can be prevented.

Figure 4:
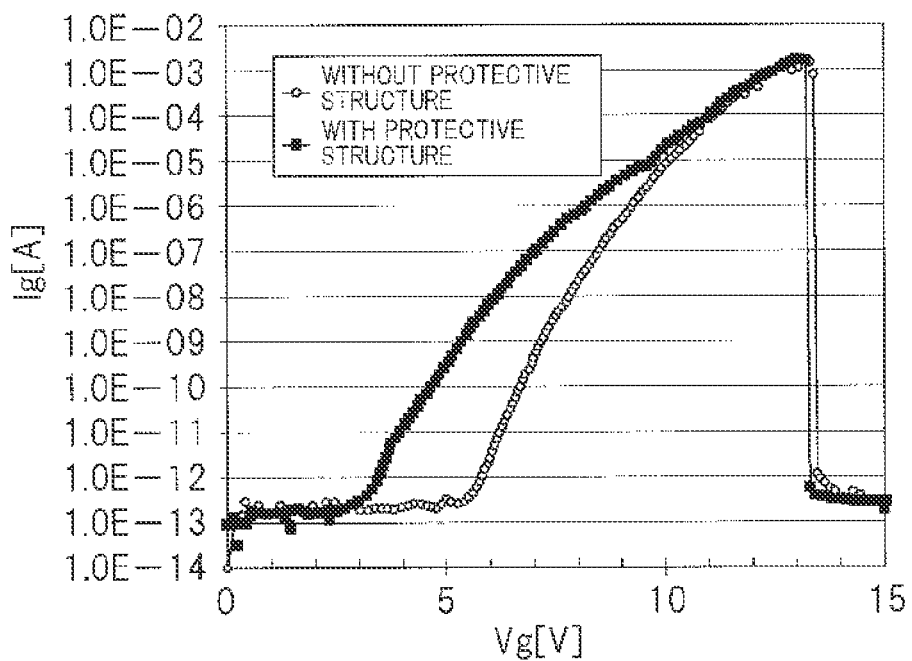
FIG. 4 is a graph illustrating breakdown voltage characteristics of a gate insulating film depending on presence and absence of a protective diode.

FIG. 4 shows a graph illustrating breakdown voltage characteristics of a gate insulating film depending on presence and absence of a protective diode. The vertical axis represents tunnel current Ig[A] and the horizontal axis represents gate voltage Vg[V]. Note that 1.0E-14 of the vertical axis indicates $1 \times 10^{14}$. As a gate insulating film, a silicon oxide film having a thickness of 80 Å (angstrom) is used. As illustrated in FIG. 4, when there is no protective diode (without protective structure), the tunnel current Ig begins to flow from the point where the gate voltage Vg is approximately 6 V, and dielectric breakdown of the gate insulating film occurs at the point where the gate voltage Vg is approximately 12 V to 13 V. On the other hand, when there is the protective diode (with protective structure), an electric current due to the reverse breakdown voltage of the diode begins to flow from the point where the gate voltage Vg is approximately 3 V, and the breakage of the gate insulating film due to the charge can be prevented. In addition, a leakage current at a gate voltage Vg of 3 V at the time of the device operation is as small as approximately 1 pA, and there is no problem in the operation.

Figure 5:
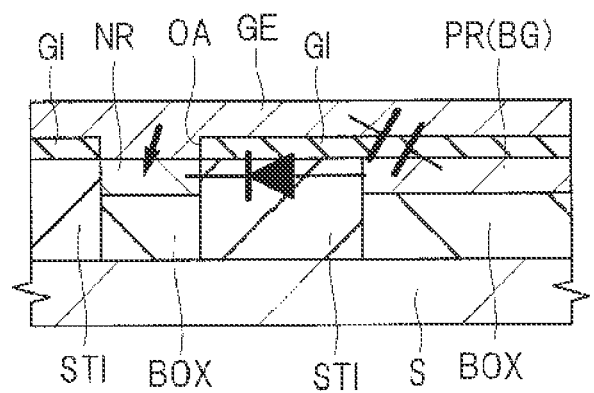
FIG. 5 is a schematic diagram illustrating a relation between a cross section of the semiconductor device (nMOS) of the first embodiment and a diode.

FIG. 5 is a schematic diagram illustrating a relation between a cross section of the semiconductor device (nMOS) of the present embodiment and a diode. As illustrated in FIG. 5, since the diode is provided between the p-type semiconductor region PR below the gate electrode GE, that is, the back gate BG and the gate electrode GE, breakage of the gate insulating film GI can be prevented. In particular, since a diode function works after the formation of the gate electrode in the semiconductor device (nMOS) of the present embodiment, the breakage of the gate insulating film due to the charge in a manufacturing process of a semiconductor device can be prevented effectively.

[Manufacturing Process]

Subsequently, a manufacturing process of the semiconductor device of the present embodiment will described with reference to drawings, and a configuration of the semiconductor device of the present embodiment will be clarified more. FIGS. 6 to 14 are sectional views and plan views illustrating the manufacturing process of the semiconductor device of the present embodiment. Note that, among the sectional views, (A) corresponds to an A-A section of the plan view, (B) corresponds to a B-B section of the plan view, and (C) corresponds to a C-C section of the plan view.

A SOI substrate illustrated in (A) to (C) of FIG. 6 is prepared. As mentioned above, this SOI substrate has the supporting substrate S, the insulating layer BOX and the semiconductor region (semiconductor layer) SR thereon. The supporting substrate S is, for example, a p-type single crystal silicon substrate. The insulating layer BOX is, for example, a silicon oxide film. In addition, the semiconductor region (semiconductor layer) SR is, for example, a single crystal silicon layer.

Subsequently, as illustrated in FIGS. 7 and 8, the element isolation region STI is formed in the SOI substrate. First, a silicon nitride film (not illustrated) serving as a hard mask is deposited over the semiconductor region SR illustrated in FIG. 7. Subsequently, after a photoresist film (not illustrated) is deposited, the photoresist film over a formation region of an element isolation trench is removed by using a photolithography technique. Thereafter, the silicon nitride film is etched by using an etching technique, and further the element isolation trench which reaches the supporting substrate S is formed.

Subsequently, after cleaning a surface of the SOI substrate including a surface of the element isolation trench, an insulating film such as a silicon oxide film is formed over the SOI substrate so as to have a film thickness enough to fill the element isolation trench. For example, a silicon oxide film is formed by CVD (Chemical Vapor Deposition) method or the like. Subsequently, the unnecessary silicon oxide film formed over the SOI substrate is removed by chemical mechanical polishing (CMP) method. The element isolation region STI formed by the above-mentioned process forms the semiconductor region SR surrounded by the element isolation region STI (FIG. 8). The region partitioned by this element isolation region STI is referred to as an active region (element formation region). This active region has a region 1A extending in the X direction and a region 2A extending in the Y direction from the end part (left side in FIG. 8) of the region 1A. The region 2A has a wide portion (projecting part) at the end part thereof (upper side in FIG. 8). As mentioned above, the nMOS is mainly formed in the region 1A, and a diode (lateral diode) for protection of the nMOS is mainly formed in the region 2A. Note that the above-mentioned wide portion in the region 2A serves as a connection part between the diode and the gate electrode GE of the nMOS.

Figure 10:
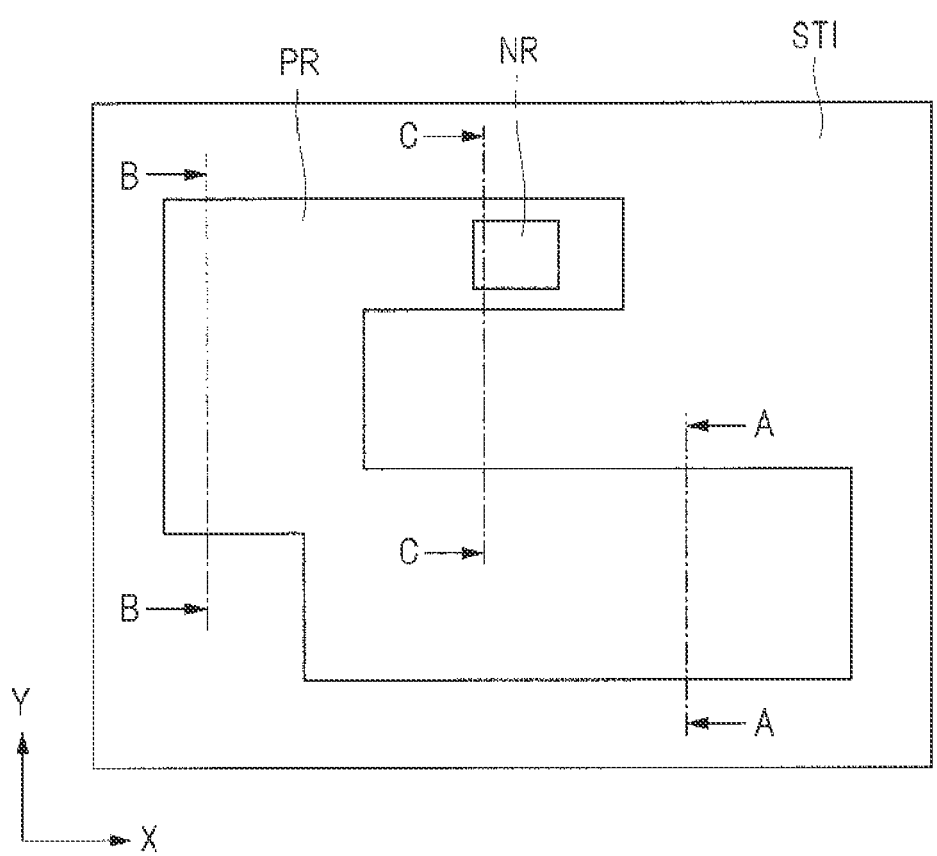
FIG. 10 is a plan view illustrating the manufacturing process of the semiconductor device of the first embodiment.

Subsequently, the p-type semiconductor region PR and the n-type semiconductor region NR are formed in the semiconductor region SR as illustrated in FIGS. 9 and 10. For example, after the above-mentioned silicon nitride film (not illustrated) is removed by etching using hot phosphoric acid or the like, an impurity is introduced into the semiconductor region SR with using a silicon oxide film (not illustrated) as a screen film. The p-type semiconductor region PR is formed by introducing a p-type impurity (for example, boron) into the semiconductor region SR by using, for example, an ion implantation method. This p-type impurity is implanted into the region 1A and the region 2A other than a part of the wide portion (region serving as a connection part between the diode and the gate electrode GE of the nMOS) ((A) to (C) of FIG. 9 and FIG. 10). When implanting the p-type impurity, a photoresist film (mask film) is formed suitably so as to prevent the impurity from being introduced into the region where impurity implantation is not necessary (above-mentioned region serving as the connection part).

On the other hand, the n-type semiconductor region NR is formed in the above-mentioned region serving as the connection part ((C) of FIG. 9 and FIG. 10). For example, the n-type semiconductor region NR is formed by introducing an n-type impurity (for example, arsenic or phosphorus) into the semiconductor region SR of the above-mentioned region by using the ion implantation method. Note that, when implanting the n-type impurity, a photoresist film (mask film) is formed suitably so as to prevent the impurity from being introduced into a region where impurity implantation is not necessary. In addition, there is no restriction in an order of formation of the p-type semiconductor region PR and the n-type semiconductor region NR, and any of the regions may be formed first. Subsequently, the silicon oxide film (screen film (not illustrated)) is removed.

Subsequently, as illustrated in FIG. 11, over the SOI substrate (p-type semiconductor region PR and n-type semiconductor region NR), the gate insulating film GI is formed. As this gate insulating film GI, for example, an insulating film such as a silicon oxide film is used. For example, by using a thermal oxidation method, the gate insulating film GI is formed over the SOI substrate (p-type semiconductor region PR and n-type semiconductor region NR). In addition, the gate insulating film GI may be formed by a CVD method. Furthermore, as the gate insulating film GI, other insulating film such as a silicon nitride film or a high-k film (high dielectric constant film) may be used in addition to a silicon oxide film, and a laminated film of these films may be used.

Subsequently, the opening OA is formed in the gate insulating film GI. For example, after a photoresist film (not illustrated) is formed, the photoresist film over the n-type semiconductor region NR is removed, and the gate insulating film GI over the n-type semiconductor region NR is removed by etching using this photoresist film as a mask. In this manner, the opening OA is formed in the gate insulating film GI, and the n-type semiconductor region NR is exposed on the bottom surface of the opening OA (see (C) of FIG. 11 and FIG. 13).

Figure 12:
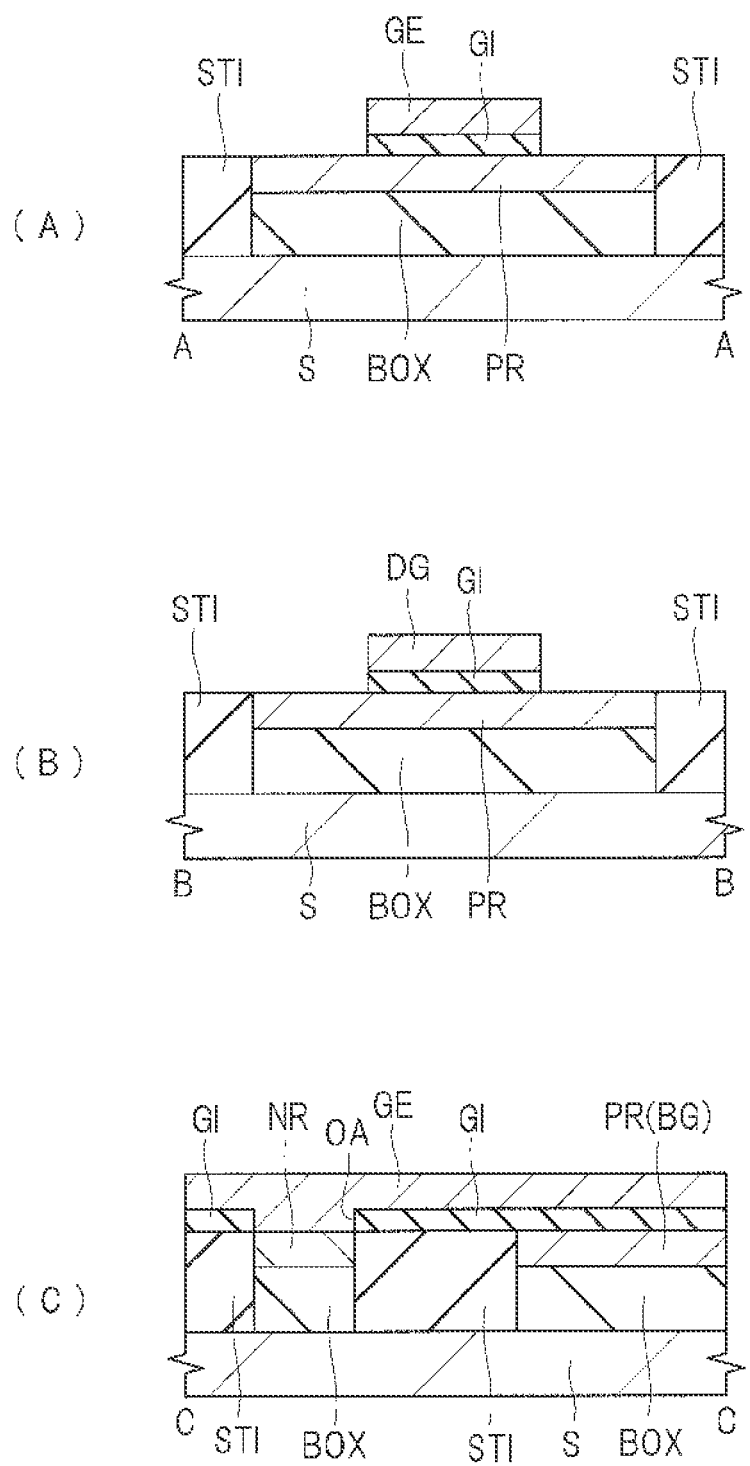
FIG. 12 is a sectional view illustrating the manufacturing process of the semiconductor device of the first embodiment.
Figure 13:
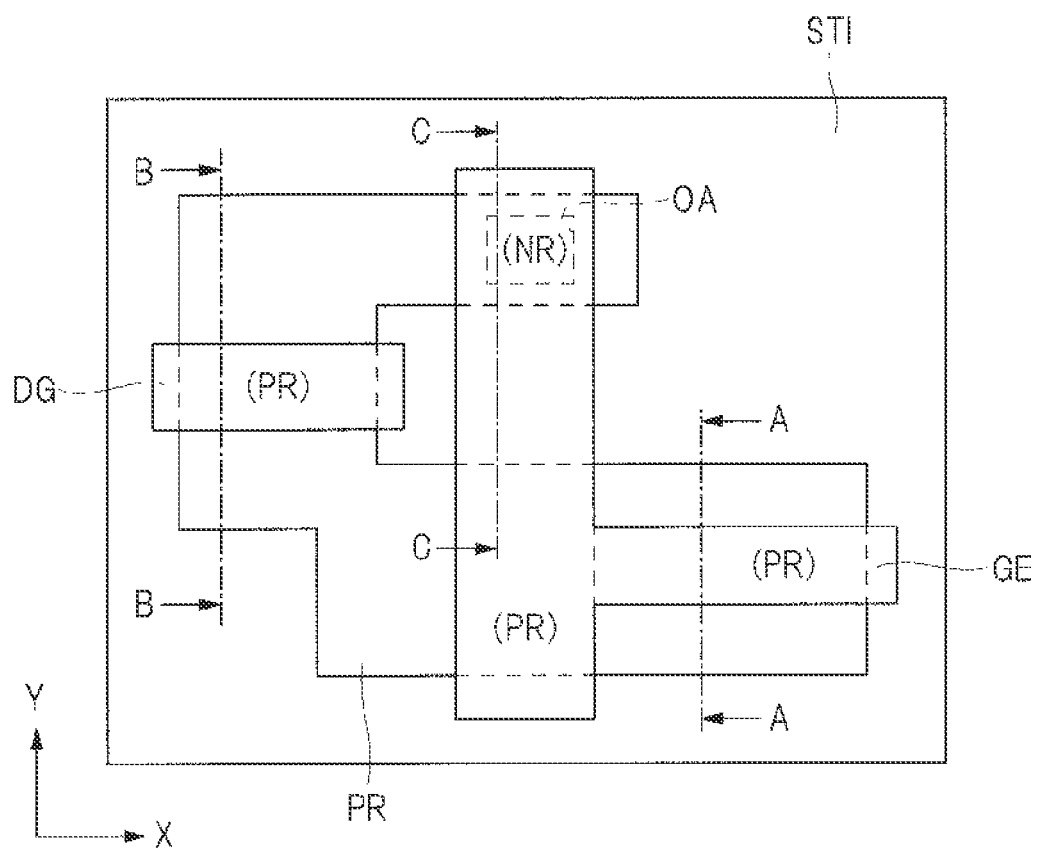
FIG. 13 is a plan view illustrating the manufacturing process of the semiconductor device of the first embodiment.

Subsequently, the gate electrode GE and the dummy gate electrode DG are formed (FIG. 12). For example, a polycrystalline silicon film is deposited by the CVD method or the like over the opening OA and the gate insulating film GI. Note that a silicon nitride film may be deposited as a hard mask over the polycrystalline silicon film. Subsequently, the gate electrode GE and the dummy gate electrode DG are formed by patterning the polycrystalline silicon film. As illustrated in FIG. 13, the gate electrode GE has a gate portion extending along the X direction in the region 1A and a gate leading portion extending in the Y direction from the region 1A to the region 2A. More specifically, the gate electrode GE has the gate leading portion extending from the region 1A to the n-type semiconductor region NR of the region 2A. In addition, the dummy gate electrode DG extends in the X direction in the region 2A.

Subsequently, as illustrated in FIG. 14, on both sides of the gate portion of the gate electrode GE extending along the X direction in the region 1A, source and drain regions (source region s and drain region d) made up of the $n^+$-type semiconductor region NP are formed. Here, in the region 2A, the $n^+$-type semiconductor region NP is formed also in one region on the n-type semiconductor region NR side (upper side in FIG. 13) out of the regions on both sides of the dummy gate electrode DG. Furthermore, in the region 2A, the $p^+$-type semiconductor region PP is formed in one region on a side reverse to the n-type semiconductor region NR side (lower side in FIG. 13) out of the regions on both sides of the dummy gate electrode DG, in other words, in the region connected to the back gate of the nMOS (see FIG. 1). More specifically, in the case of implanting the n-type impurity of the $n^+$-type semiconductor region NP, a photoresist film (mask film) is formed suitably so as to prevent the impurity from being introduced into the above-mentioned region where impurity implantation is not necessary. Also, in the case of implanting the p-type impurity of the p$^+$-type semiconductor region PP, a photoresist film (mask film) having an opening corresponding to the above-mentioned region is formed and then the impurity is implanted. Note that there is no restriction in an order of formation of the n$^+$-type semiconductor region NP and the p$^+$-type semiconductor region PP, and any of the regions may be formed first.

By the process above, the nMOS having the gate electrode GE disposed via the gate insulating film GI over the p-type semiconductor region PR and the source and drain regions (s and d) disposed in the semiconductor region SR on both sides of this gate electrode GE and made up of the n$^+$-type semiconductor region NP can be formed. In addition, the diode having the n$^+$-type semiconductor region NP and the p$^+$-type semiconductor region PP can be formed. Further, the p-type semiconductor region PR (back gate) below the gate electrode GE of the nMOS is connected to one end (p$^+$-type semiconductor region PP) of the diode, and the gate electrode GE is connected to the n-type semiconductor region NR linked to the other end (n$^+$-type semiconductor region NP) of the diode.

Then, an interlayer insulating film, a plug (connection part), wirings and others are formed over the nMOS and diode, but detailed descriptions thereof are omitted in the present embodiment. The plug connects wirings and portions of the nMOS and diode.

As described above, in the present embodiment, by providing the diode between the back gate and the gate electrode GE of the nMOS, the breakage of the gate insulating film GI of the nMOS can be prevented. In particular, in the manufacturing process of the semiconductor device, even in the case where the etching process and the ashing process of the photoresist film are performed under the plasma atmosphere and the charge tends to be accumulated in the SOI substrate, the breakage of the gate insulating film can be prevented by the function of the diode as mentioned above. Furthermore, in the present embodiment, since the n-type semiconductor region NR is formed in advance and is connected to the gate electrode GE, the diode function works after the formation of the gate electrode GE, so that the breakage of the gate insulating film due to the charge in the manufacturing process of the semiconductor device can be prevented effectively.

Second Embodiment

In the first embodiment, the gate insulating film GI over the n-type semiconductor region NR is removed and the n-type semiconductor region NR is connected to the gate electrode GE. Alternatively, the n-type semiconductor region NR and the gate electrode GE may be connected via a thin insulating film (tunnel insulating film).

[Description of Structure]

FIG. 15 is a sectional view illustrating a configuration of a semiconductor device (nMOS) of the present embodiment. Note that the semiconductor device of the present embodiment is the same as that of the first embodiment except the configuration where a thin insulating film (tunnel insulating film) IL is disposed in the opening OA over the n-type semiconductor region NR. Components similar to those of the first embodiment are denoted by the same reference characters, and detailed descriptions thereof are omitted.

As illustrated in FIG. 15, the nMOS of the present embodiment is formed over the main surface of the semiconductor region (semiconductor layer, SR) constituting the SOI substrate. As illustrated in (A) of FIG. 15, this nMOS has the gate electrode GE disposed via the gate insulating film GI over the p-type semiconductor region PR (semiconductor region SR) and the source region (s) and drain region (d) which are made up of the n$^+$-type semiconductor regions NP disposed in the semiconductor region (semiconductor layer, SR) on both sides of the gate electrode GE.

In addition, as illustrated in (B) of FIG. 15, the diode has the n$^+$-type semiconductor region (n$^+$-type diffusion layer) NP, the p$^+$-type semiconductor region (p$^+$-type diffusion layer) PP and the p-type semiconductor region PR therebetween. When the diode operates, the n$^+$-type semiconductor region NP serves as a cathode, and the p$^+$-type semiconductor region PP serves as an anode. An impurity concentration of the p-type semiconductor region (p-type diffusion layer) PR is lower than an impurity concentration of the p$^+$-type semiconductor region PP. Also, the n$^+$-type semiconductor region NP is provided so as to be in contact with the n-type semiconductor region (n-type diffusion layer) NR described later. An impurity concentration of the n-type semiconductor region (n-type diffusion layer) NR is lower than an impurity concentration of the n$^+$-type semiconductor region NP.

Then, over the above-mentioned p-type semiconductor region PR, the dummy gate electrode DG disposed via the gate insulating film GI is provided. The dummy gate electrode DG is formed of the same layer as the gate electrode GE. The dummy gate electrode DG is not involved in the operation of the nMOS. Namely, no gate potential is applied to the dummy gate electrode DG, and the dummy gate electrode DG is maintained in, for example, a floating state. In addition, the dummy gate electrode DG may be electrically connected (fixed) to the cathode (n$^+$-type semiconductor region NP) and the anode (p$^+$-type semiconductor region PP) of the diode.

In this way, the diode is formed by a PN junction of the n$^+$-type semiconductor region (n$^+$-type diffusion layer) NP on the cathode side and the p-type semiconductor region PR and the p$^+$-type semiconductor region (p$^+$-type diffusion layer) PP on the anode side.

In addition, as illustrated in (C) of FIG. 15, the p-type semiconductor region PR (semiconductor region SR) below the gate electrode GE, that is, the back gate is connected to one end (p$^+$-type semiconductor region PP) of the diode. Also, the gate electrode GE is connected via the insulating film (tunnel insulating film) IL to the n-type semiconductor region NR linked to the other end (n$^+$-type semiconductor region NP) of the diode.

Here, the insulating film (tunnel insulating film) IL is disposed in the opening OA over the n-type semiconductor region NR. A film thickness of this insulating film IL is smaller than a film thickness of the gate insulating film GI.

The semiconductor device of the present embodiment has a protective structure made up of a path of the tunnel current flowing through the insulating film IL and the diode. Also in such a case, the breakdown voltage of the insulating film IL and the diode is set to be lower than the dielectric breakdown voltage of the gate insulating film GI, so that the breakage of the gate insulating film GI of the nMOS can be prevented. Note that, with respect to the insulating film IL, even when the dielectric breakdown occurs due to the charge, the leakage current at the time of operation is small due to the reverse breakdown voltage of the diode, and there is no problem in the operation.

Figure 16:
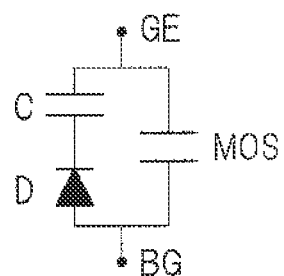
FIG. 16 is a circuit diagram schematically illustrating the configuration of the semiconductor device (nMOS) of the second embodiment.
Figure 17:
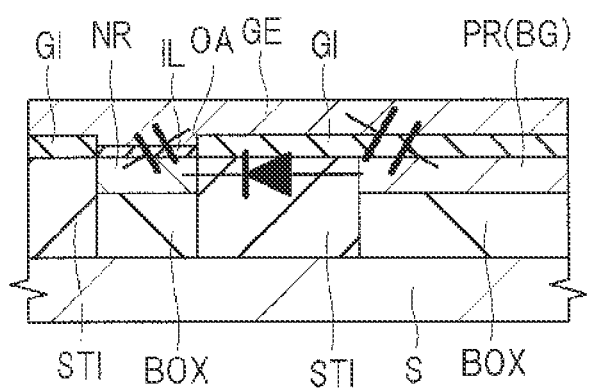
FIG. 17 is a schematic diagram illustrating a relation of a cross section of the semiconductor device (nMOS) of the second embodiment, the diode and the insulating film.

FIG. 16 is a circuit diagram schematically illustrating the configuration of the semiconductor device (nMOS) of the present embodiment. As illustrated in FIG. 16, the diode D and a capacitor C formed of the insulating film IL are provided between the back gate BG and the gate electrode GE of the nMOS. FIG. 17 is a schematic diagram illustrating a relation of a cross section of the semiconductor device (nMOS) of the present embodiment, the diode and the insulating film. As illustrated in FIG. 17, since the diode and the insulating film IL are provided between the p-type semiconductor region PR (semiconductor region SR) below the gate electrode GE, GE, that is, the back gate BG and the gate electrode GE, the breakage of the gate insulating film GI can be prevented.

[Manufacturing Process]

Subsequently, a manufacturing process of the semiconductor device of the present embodiment will described with reference to drawings, and a configuration of the semiconductor device of the present embodiment will be clarified more. FIGS. 18 and 19 are sectional views illustrating the manufacturing process of the semiconductor device of the present embodiment. Note that the detailed descriptions of the same process as that of the first embodiment are omitted.

The same SOI substrate as that of the first embodiment is prepared (see FIG. 6). Subsequently, in the same way as the first embodiment, the element isolation region STI is formed in the SOI substrate, and further the p-type semiconductor region PR and the n-type semiconductor region NR are formed in the semiconductor region SR of the SOI substrate (see FIGS. 7 to 10). Thus, the n-type semiconductor region NR is formed in a part of the wide portion in the region 2A (region serving as a connection part between the diode and the gate electrode GE of the nMOS), and the p-type semiconductor region PR is formed in the region 1A and in the region 2A other than the above-mentioned part of the wide portion (see FIG. 9 and FIG. 10).

Subsequently, as illustrated in FIG. 18, the gate insulating film GI is formed over the SOI substrate (p-type semiconductor region PR and n-type semiconductor region NR). As this gate insulating film GI, for example, an insulating film such as a silicon oxide film is used. The gate insulating film GI is formed over the SOI substrate (p-type semiconductor region PR and n-type semiconductor region NR) by using, for example, the thermal oxidation method. In addition, the gate insulating film GI may be formed by the CVD method.

Subsequently, the opening OA is formed in the gate insulating film GI. For example, after a photoresist film (not illustrated) is formed, the photoresist film over the n-type semiconductor region NR is removed, and the gate insulating film GI over the n-type semiconductor region NR is removed by using the etching technique. In this manner, the opening OA is formed in the gate insulating film GI, and the n-type semiconductor region NR is exposed on the bottom surface of the opening OA (see FIG. 11).

Subsequently, the insulating film IL is formed over the surface of the n-type semiconductor region NR. For example, by oxidizing the surface of the n-type semiconductor region NR, the insulating film IL (here, oxide film) is formed over the n-type semiconductor region NR. At this time, oxidation progresses also in a remaining part of the gate insulating film GI, and a film thickness of the gate insulating film GI (here, silicon oxide film) becomes large. The formation method of an oxide film having a different film thickness like this is often used as a multi-oxidation method in the manufacturing process of the semiconductor device. As described above, the process of forming an oxide film having a different film thickness has good affinity with the manufacturing process of the semiconductor device having nMOS and CMOS, and can form the insulating film IL and the gate insulating film GI with good controllability.

Subsequently, as illustrated in FIG. 19, the gate electrode GE and the dummy gate electrode DG are formed. For example, a polycrystalline silicon film is deposited over the insulating film IL and the gate insulating film GI by the CVD method or the like, and the polycrystalline silicon film is patterned, thereby forming the gate electrode GE and the dummy gate electrode DG. A planar shape of the gate electrode GE and the dummy gate electrode DG is the same as that of the first embodiment (FIG. 13).

Thereafter, in the same way as the first embodiment, on both sides of the gate portion of the gate electrode GE extending along the X direction in the region 1A, source and drain regions (source region s and drain region d) made up of the $n^+$-type semiconductor region NP are formed. Here, in the region 2A, the $n^+$-type semiconductor region NP is formed also in one region on the n-type semiconductor region NR side (upper side in FIG. 13) out of the regions on both sides of the dummy gate electrode DG. Furthermore, in the region 2A, the $p^+$-type semiconductor region PP is formed in one region on a side reverse to the n-type semiconductor region NR side (lower side in FIG. 13) out of the regions on both sides of the dummy gate electrode DG, in other words, in the region connected to the back gate of the nMOS (see FIG. 14 and FIG. 1).

By the process above, the nMOS having the gate electrode GE disposed via the gate insulating film GI over the p-type semiconductor region PR and the source and drain regions (s and d) disposed in the semiconductor region SR on both sides of this gate electrode GE and made up of the $n^+$-type semiconductor region NP can be formed. In addition, the diode having the $n^+$-type semiconductor region NP, the p-type semiconductor region PR and the $p^+$-type semiconductor region PP can be formed. Further, the p-type semiconductor region PR (back gate) below the gate electrode GE of the nMOS is connected to one end ($p^+$-type semiconductor region PP) of the diode, and the gate electrode GE is connected to the n-type semiconductor region NR linked to the other end ($n^+$-type semiconductor region NP) of the diode via the insulating film IL.

Then, an interlayer insulating film, a plug (connection part), wirings and others are formed over the nMOS and diode, but detailed descriptions thereof are omitted in the present embodiment.

As described above, in the present embodiment, by providing the diode and the insulating film IL thinner than the gate insulating film of the nMOS between the back gate and the gate electrode GE of the nMOS, the breakage of the gate insulating film GI of the nMOS can be prevented. In particular, in the manufacturing process of the semiconductor device, even in the case where the etching process and the ashing process of the photoresist film are performed under the plasma atmosphere and the charge tends to be accumulated in the SOI substrate, the breakage of the gate insulating film can be prevented by the function of the diode as mentioned above. Furthermore, in the present embodiment, since the n-type semiconductor region NR is formed in advance and is connected to the gate electrode GE, the diode function works after the formation of the gate electrode GE, so that the breakage of the gate insulating film due to the charge in the manufacturing process of the semiconductor device can be prevented effectively.

Third Embodiment

In the first embodiment, the gate insulating film. GI over the n-type semiconductor region NR is removed. Alternatively, a defect part may be formed in the gate insulating film between the n-type semiconductor region NR and the gate electrode GE without removing the gate insulating film GI over the n-type semiconductor region NR.

[Description of Structure]

FIG. 20 is a sectional view illustrating a configuration of a semiconductor device (nMOS) of the present embodiment. Note that the semiconductor device of the present embodiment is the same as that of the first embodiment except the configuration where a defect DF is formed in the gate insulating film GI over the n-type semiconductor region NR. Therefore, components are denoted by the same reference characters, and detailed descriptions thereof are omitted.

As illustrated in FIG. 20, the nMOS of the present embodiment is formed over the main surface of the semiconductor region (semiconductor layer, SR) constituting the SOI substrate. As illustrated in (A) of FIG. 20, this nMOS has the gate electrode GE disposed via the gate insulating film GI over the p-type semiconductor region PR (semiconductor region SR) and the source region (s) and drain region (d) which are made up of the $n^+$-type semiconductor regions NP disposed in the semiconductor region (semiconductor layer, SR) on both sides of the gate electrode GE.

In addition, as illustrated in (B) of FIG. 20, the diode has the $n^+$-type semiconductor region ($n^+$-type diffusion layer) NP, the $p^+$-type semiconductor region ($p^+$-type diffusion layer) PP and the p-type semiconductor region PR therebetween. When the diode operates, the $n^+$-type semiconductor region NP serves as a cathode, and the $p^+$-type semiconductor region PP serves as an anode. An impurity concentration of the p-type semiconductor region (p-type diffusion layer) PR is lower than an impurity concentration of the $p^+$-type semiconductor region PP. Also, the $n^+$-type semiconductor region NP is provided so as to be in contact with the n-type semiconductor region (n-type diffusion layer) NR described later. An impurity concentration of the n-type semiconductor region (n-type diffusion layer) NR is lower than an impurity concentration of the $n^+$-type semiconductor region NP.

Then, over the above-mentioned p-type semiconductor region PR, the dummy gate electrode DG disposed via the gate insulating film GI is provided. The dummy gate electrode DG is formed of the same layer as the gate electrode GE. The dummy gate electrode DG is not involved in the operation of the nMOS. Namely, no gate potential is applied to the dummy gate electrode DG, and the dummy gate electrode DG is maintained in, for example, a floating state. In addition, the dummy gate electrode DG may be electrically connected (fixed) to the cathode ($n^+$-type semiconductor region NP) and the anode ($p^+$-type semiconductor region PP) of the diode.

In this way, the diode is formed by a PN junction of the $n^+$-type semiconductor region ($n^+$-type diffusion layer) NP on the cathode side and the p-type semiconductor region PR and the $p^+$-type semiconductor region ($p^+$-type diffusion layer) PP on the anode side.

In addition, addition, as illustrated in (C) of FIG. 20, the p-type semiconductor region PR (semiconductor region SR) below the gate electrode GE, that is, the back gate is connected to one end ($p^+$-type semiconductor region PP) of the diode. Also, the gate electrode GE is connected via the defect DF in the gate insulating film GI to the n-type semiconductor region NR linked to the other end ($n^+$-type semiconductor region NP) of the diode.

Here, the defect DF is provided in the gate insulating film GI over the n-type semiconductor region NR. The defect DF is a region where Si—Si connection of the gate insulating film GI is broken. The defect DF like this can be formed by, for example, ion implantation or dry etching. It is also possible to provide such a defect in advance in the formation region of the gate insulating film GI and then form the gate insulating film having the defect part by performing an oxidation treatment or the like. In addition, it is also possible to form a defect part by performing a process such as ion implantation after forming the gate insulating film.

The semiconductor device of the present embodiment has a protective structure which is made up of a path of a leakage current flowing through the defect DF of the gate insulating film. GI having the defect DF and the diode. Note that, even when the leakage current flowing through the defect DF is generated, the leakage current at the time of operation is small due to the reverse breakdown voltage of the diode, and there is no problem in the operation.

Figure 21:
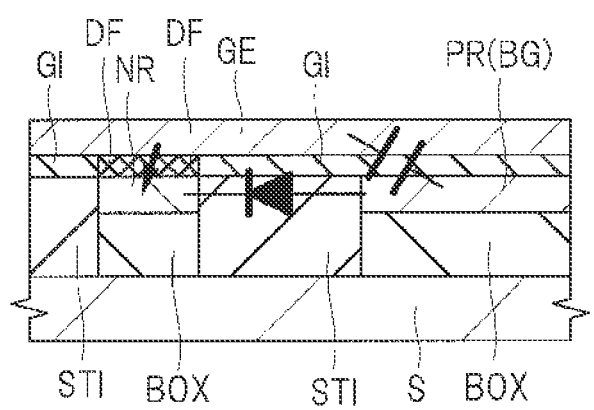
FIG. 21 is a schematic diagram illustrating a relation of a cross section of the semiconductor device (nMOS) of the third embodiment, the diode and the gate insulating film.

FIG. 21 is a schematic diagram illustrating a relation of a cross section of the semiconductor device (nMOS) of the present embodiment, the diode and the gate insulating film. As illustrated in FIG. 21, the diode D and the path of the leakage current through the defect DF of the gate insulating film GI are provided between the back gate and the gate electrode GE of the nMOS.

As described above, also in the present embodiment, by the path of the leakage current flowing through the defect DF of the gate insulating film GI having the defect DF and the diode, the breakage of the gate insulating film GI of the nMOS can be prevented.

[Manufacturing Process]

Subsequently, a manufacturing process of the semiconductor device of the present embodiment will described with reference to drawings, and a configuration of the semiconductor device of the present embodiment will be clarified more. FIGS. 22 to 24 are sectional views illustrating the manufacturing process of the semiconductor device of the present embodiment. Note that the detailed descriptions of the same process as that of the first embodiment are omitted.

The same SOI substrate as that of the first embodiment is prepared (see FIG. 6). Subsequently, in the same way as the first embodiment, the element isolation region STI is formed in the SOI substrate, and further the p-type semiconductor region PR and the n-type semiconductor region NR are formed in the semiconductor region SR of the SOI substrate (see FIGS. 7 to 10). Thus, the n-type semiconductor region NR is formed in a part of the wide portion in the region 2A (region serving as a connection part between the diode and the gate electrode GE of the nMOS), and the p-type semiconductor region PR is formed in the region 1A and in the region 2A other than the above-mentioned part of the wide portion (see FIG. 9 and FIG. 10).

Subsequently, as illustrated in FIG. 22, the gate insulating film GI is formed over the SOI substrate (p-type semiconductor region PR and n-type semiconductor region NR). As this gate insulating film GI, for example, an insulating film such as a silicon oxide film is used. The gate insulating film GI is formed over the SOI substrate (p-type semiconductor region PR and n-type semiconductor region NR) by using, for example, the thermal oxidation method. In addition, the gate insulating film GI may be formed by the CVD method.

Subsequently, as illustrated in FIG. 23, the defect DF is formed in the gate insulating film GI located over the n-type semiconductor region NR. For example, after a photoresist film (not illustrated) is formed, the photoresist film over the n-type semiconductor region NR is removed, and an impurity ion is implanted. In this manner, the defect DF is formed in the gate insulating film GI ((C) of FIG. 23). The impurity ion may be an n-type impurity such as As and Sb. In addition, an inactive element such as Ar may be implanted. Also, the defect may be introduced by the dry etching or the like in addition to the ion implantation.

Subsequently, as illustrated in FIG. 24, the gate electrode GE and the dummy gate electrode DG are formed. For example, a polycrystalline silicon film is deposited over the gate insulating film GI by the CVD method or the like, and the polycrystalline silicon film is patterned, thereby forming the gate electrode GE and the dummy gate electrode DG. A planar shape of the gate electrode GE and the dummy gate electrode DG is the same as that of the first embodiment (FIG. 13).

Thereafter, in the same way as the first embodiment, on both sides of the gate portion of the gate electrode GE extending along the X direction in the region 1A, source and drain regions (source region s and drain region d) made up of the $n^+$-type semiconductor region NP are formed. Here, in the region 2A, the $n^+$-type semiconductor region NP is formed also in one region on the n-type semiconductor region NR side (upper side in FIG. 13) out of the regions on both sides of the dummy gate electrode DG. Furthermore, in the region 2A, the $p^+$-type semiconductor region PP is formed in one region on a side reverse to the n-type semiconductor region NR side (lower side in FIG. 13) out of the regions on both sides of the dummy gate electrode DG, in other words, in the region connected to the back gate of the nMOS (see FIG. 14).

By the process above, the nMOS having the gate electrode GE disposed via the gate insulating film GI over the p-type semiconductor region PR and the source and drain regions (s and d) disposed in the semiconductor region SR on both sides of this gate electrode GE and made up of the $n^+$-type semiconductor region NP can be formed. In addition, the diode having the $n^+$-type semiconductor region NP, the p-type semiconductor region PR and the $p^+$-type semiconductor region PP can be formed. Further, the p-type semiconductor region PR (back gate) below the gate electrode GE of the nMOS is connected to one end ($p^+$-type semiconductor region PP) of the diode, and the gate electrode GE is connected to the n-type semiconductor region NR linked to the other end ($n^+$-type semiconductor region NP) of the diode via the defect part in the gate insulating film GI.

Then, an interlayer insulating film, a plug (connection part), wirings and others are formed over the nMOS and diode, but detailed descriptions thereof are omitted in the present embodiment.

As described above, in the present embodiment, by providing the diode and the gate insulating film GI having the defect DF between the back gate and the gate electrode GE of the nMOS, the breakage of the gate insulating film GI of the nMOS can be prevented. In particular, in the manufacturing process of the semiconductor device, even in the case where the etching process and the ashing process are performed under the plasma atmosphere and the charge is accumulated in the SOI substrate, the breakage of the gate insulating film can be prevented by the function of the diode as mentioned above. Furthermore, in the present embodiment, since the n-type semiconductor region NR is formed in advance and is connected to the gate electrode GE, the diode function works after the formation of the gate electrode, so that the breakage of the gate insulating film due to the charge in the manufacturing process of the semiconductor device can be prevented effectively.

Fourth Embodiment

In the first embodiment, the diode having the PN junction of the $n^+$-type semiconductor region NP, the p-type semiconductor region PR and the $p^+$-type semiconductor region PP is used. Alternatively, a diode having a PNP junction may be used. In this case, even when a negative bias (negative charge) is applied to the gate electrode, the gate current does not flow and the protecting function by the diode can be exhibited.

[Description of Structure]

Figure 26:
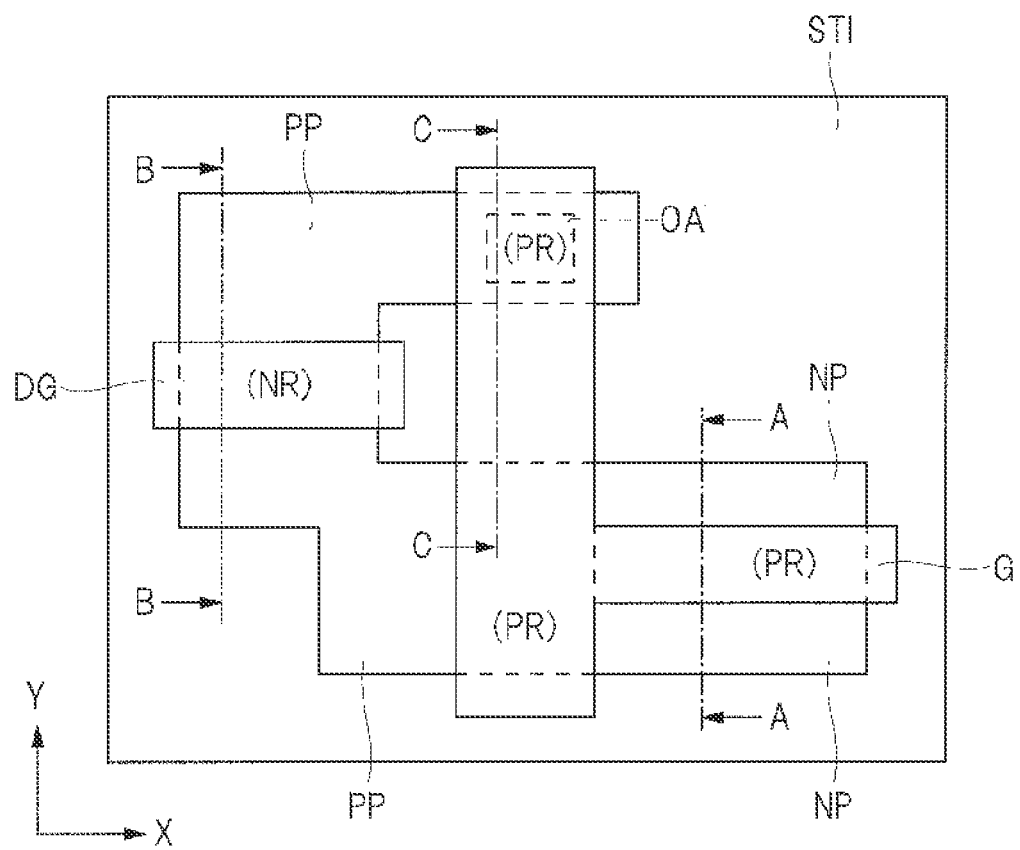
FIG. 26 is a plan view illustrating a configuration of the semiconductor device (nMOS) of the fourth embodiment.

FIG. 25 is a sectional view illustrating a configuration of a semiconductor device (nMOS) of the present embodiment, and FIG. 26 is a plan view thereof. In FIG. 25, (A) corresponds to an A-A section of FIG. 26, (B) corresponds to a B-B section of FIG. 26, and (C) corresponds to a C-C section of FIG. 26. Note that the same components as those of the first embodiment are denoted by the same reference characters, and detailed descriptions thereof are omitted.

As illustrated in FIGS. 25 and 26, the nMOS of the present embodiment is formed over the main surface of the semiconductor region (semiconductor layer, SR) constituting the SOI substrate. As illustrated in (A) of FIG. 25, this nMOS has the gate electrode GE disposed via the gate insulating film GI over the p-type semiconductor region PR (semiconductor region SR) and the source region (s) and drain region (d) which are made up of the $n^+$-type semiconductor regions NP disposed in the semiconductor region (semiconductor layer, SR) on both sides of the gate electrode GE. In addition, as illustrated in (B) of FIG. 25, the diode has the PNP junction. More specifically, the diode has the n-type semiconductor region NR located below the dummy gate electrode DG and the $p^+$-type semiconductor regions ($p^+$-type diffusion layer) PP located on both sides of the dummy gate electrode DG. When the diode operates, the n-type semiconductor region NR serves as a cathode, and the $p^+$-type semiconductor region PP serves as an anode.

The above-mentioned dummy gate electrode DG is disposed via the gate insulating film GI over the n-type semiconductor region NR. The dummy gate electrode DG is formed of the same layer as the gate electrode GE. The dummy gate electrode DG is not involved in the operation of the nMOS. Namely, no gate potential is applied to the dummy gate electrode DG, and the dummy gate electrode DG is maintained in, for example, a floating state. In addition, the dummy gate electrode DG may be electrically connected (fixed) to the cathode ($n^+$-type semiconductor region NP) and the anode ($p^+$-type semiconductor region PP) of the diode.

In this way, the diode is configured so as to have the PNP junction made up of the $p^+$-type semiconductor region ($p^+$-type diffusion layer) PP located on one side of the dummy gate electrode DG, the n-type semiconductor region NR located below the dummy gate electrode DG and the $p^+$-type semiconductor region ($p^+$-type diffusion layer) PP located on the other side of the dummy gate electrode DG.

In addition, as illustrated in (C) of FIG. 25, the p-type semiconductor region PR (semiconductor region SR) below the gate electrode GE, that is, the back gate is connected to one end ($p^+$-type semiconductor region PP) of the diode. Also, the gate electrode GE is connected to the p-type semiconductor region PR linked to the other end ($p^+$-type semiconductor region PP) of the diode.

Figure 27:
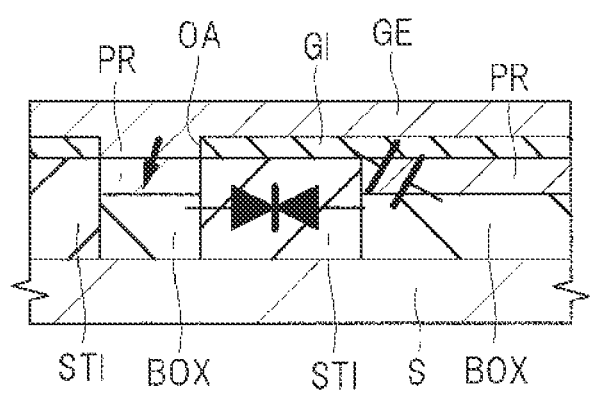
FIG. 27 is a schematic diagram illustrating a relation between a cross section of the semiconductor device (nMOS) of the fourth embodiment and the diode.

FIG. 27 is a schematic diagram illustrating a relation between a cross section of the semiconductor device (nMOS) of the present embodiment and the diode. As illustrated in FIG. 27, since the PNP type diode is provided between the p-type semiconductor region PR (semiconductor region SR) below the gate electrode GE, that is, the back gate and the gate electrode GE, the breakage of the gate insulating film GI can be prevented. In particular, even when a negative bias is applied to the gate electrode GE, the protecting function by the diode can be exhibited. For example, when a negative bias is applied to the gate electrode GE in the case of the first embodiment (FIG. 2), a leakage current by a forward current of the diode is generated. Meanwhile, in the present embodiment, even when a negative bias is applied to the gate electrode GE, a leakage current does not flow between the back gate and the gate electrodes GE, and a protection effect can be exhibited.

[Manufacturing Process]

Subsequently, a manufacturing process of the semiconductor device of the present embodiment will described with reference to drawings, and a configuration of the semiconductor device of the present embodiment will be clarified more. FIGS. 28 to 31 are sectional views and a plan view illustrating the manufacturing process of the semiconductor device of the present embodiment. Note that the detailed descriptions of the same process as that of the first embodiment are omitted.

The same SOI substrate as that of the first embodiment is prepared (see FIG. 6), and the element isolation region STI is formed in the SOI substrate in the same way as the first embodiment.

Figure 29:
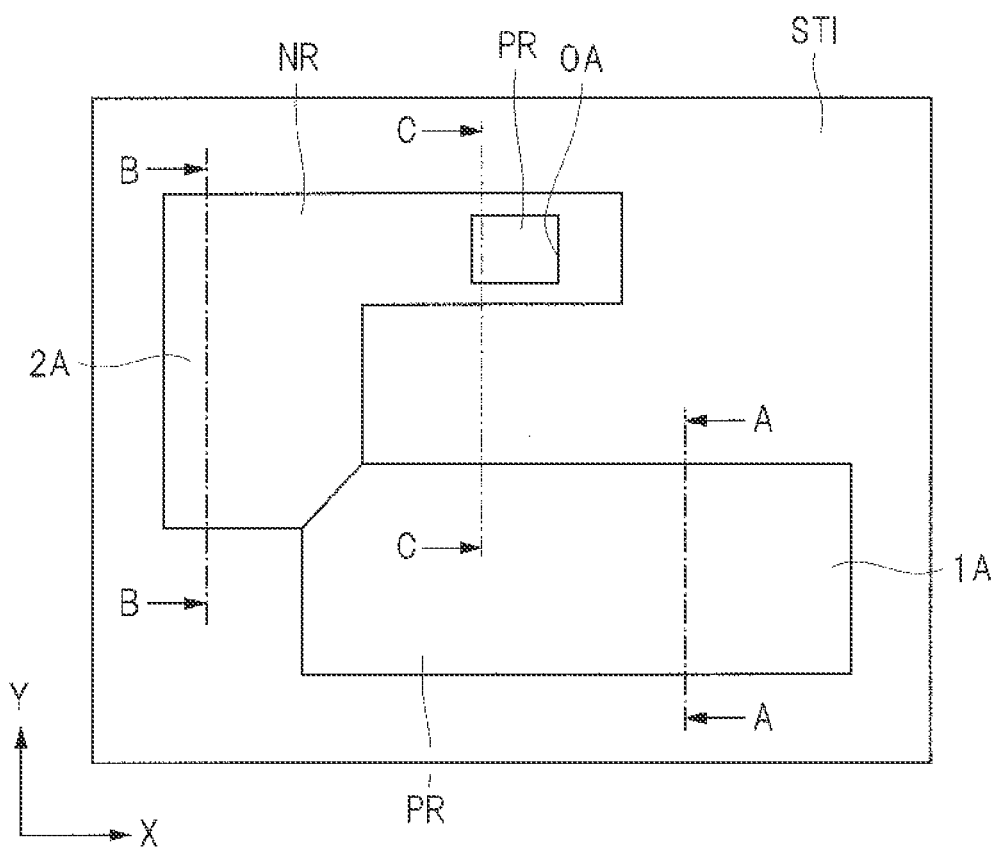
FIG. 29 is a plan view illustrating the manufacturing process of the semiconductor device of the fourth embodiment.

Subsequently, as illustrated in FIGS. 28 and 29, in the semiconductor region SR, the p-type semiconductor region PR and n-type semiconductor region NR are formed. For example, an impurity is introduced into the semiconductor region SR with using a silicon oxide film (not illustrated) as a screen film. The p-type semiconductor region PR is formed by introducing a p-type impurity (for example, boron) into the semiconductor region SR by using, for example, the ion implantation method. This p-type impurity is implanted into the region 1A and a part of the wide portion in the region 2A (region serving as a connection part between the diode and the gate electrode GE of the nMOS) (FIG. 29). In the case of implanting the p-type impurity, a photoresist film (mask film) is suitably formed so as to prevent the impurity from being introduced into the region where the impurity implantation is not necessary.

On the other hand, in the region 2A other than the part of the wide portion (region serving as a connection part between the diode and the gate electrode GE of the nMOS), the n-type semiconductor region NR is formed ((B) of FIG. 28 and FIG. 29). The n-type semiconductor region NR is formed by introducing an n-type impurity (for example, arsenic or phosphorus) into the semiconductor region SR of the above-mentioned region by using, for example, the ion implantation method. Note that, in the case of implanting the n-type impurity, a photoresist film (mask film) is suitably formed so as to prevent the impurity from being introduced into the region where the impurity implantation is not necessary. In addition, there is no restriction in the order of formation of the p-type semiconductor region PR and the n-type semiconductor region NR, and any of the regions may be formed first. Subsequently, the silicon oxide film (screen film (not illustrated)) is removed.

Subsequently, as illustrated in FIG. 30, the gate insulating film GI is formed over the SOI substrate (p-type semiconductor region PR and n-type semiconductor region NR). As this gate insulating film GI, for example, an insulating film such as a silicon oxide film is used. The gate insulating film GI is formed over the SOI substrate (p-type semiconductor region PR and n-type semiconductor region NR) by using, for example, the thermal oxidation method. In addition, the gate insulating film GI may be formed by the CVD method.

Subsequently, the opening OA is formed in the gate insulating film GI. For example, after a photoresist film (not illustrated) is formed, the photoresist film over the p-type semiconductor region PR is removed, and the gate insulating film GI over the p-type semiconductor region PR is removed by using the etching technique. In this manner, the opening OA is formed in the gate insulating film GI, and the p-type semiconductor region PR is exposed on the bottom surface of the opening OA (see (C) of FIG. 30).

Subsequently, as illustrated in FIG. 31, the gate electrode GE and the dummy gate electrode DG are formed. For example, a polycrystalline silicon film is deposited over the insulating film IL and the gate insulating film GI by the CVD method or the like, and the polycrystalline silicon film is patterned, thereby forming the gate electrode GE and the dummy gate electrode DG. A planar shape of the gate electrode GE and the dummy gate electrode DG is the same as that of the first embodiment.

Subsequently, on both sides of the gate portion of the gate electrode GE extending along the X direction in the region 1A, source and drain regions (source region s and drain region d) made up of the $n^+$-type semiconductor region NP are formed (see FIG. 26). In addition, in the region 2A, the $p^+$-type semiconductor region PP is formed in the regions on both sides of the dummy gate electrode DG (see FIG. 26). The $n^+$-type semiconductor region NP and the $p^+$-type semiconductor region PP are formed by the ion implantation method. In the case of implanting each of impurities, the photoresist film (mask film) is suitably formed so as to prevent the impurity from being introduced into the region where the impurity implantation is not necessary.

By the process above, the nMOS having the gate electrode GE disposed via the gate insulating film GI over the p-type semiconductor region PR and the source and drain regions (s and d) disposed in the semiconductor region SR on both sides of this gate electrode GE and made up of the $n^+$-type semiconductor region NP can be formed. In addition, the PNP type diode having the n-type semiconductor region NR located below the dummy gate electrode DG and the $p^+$-type semiconductor regions ($p^+$-type diffusion layer) PP located on both sides of the dummy gate electrode DG can be formed. Further, the p-type semiconductor region PR (back gate) below the gate electrode GE of the nMOS is connected to one end ($p^+$-type semiconductor region PP) of the diode, and the gate electrode GE is connected to the p-type semiconductor region PR linked to the other end ($p^+$-type semiconductor region PP) of the diode via the opening OA.

Then, an interlayer insulating film, a plug (connection part), wirings and others are formed over the nMOS and diode, but detailed descriptions thereof are omitted in the present embodiment.

As described above, in the present embodiment, by providing the PNP type diode between the back gate and the gate electrode GE of the nMOS, the breakage of the gate insulating film GI of the nMOS can be prevented. In particular, even when a negative bias is applied to the gate electrode, the protecting function by the diode can be exhibited. Further, in the manufacturing process of the semiconductor device, even in the case where the etching process and the ashing process of the photoresist film are performed under the plasma atmosphere and the charge tends to be accumulated in the SOI substrate, the breakage of the gate insulating film can be prevented by the function of the diode as mentioned above. Furthermore, in the present embodiment, since the p-type semiconductor region PR is formed in advance and is connected to the gate electrode GE, the diode function works after the formation of the gate electrode GE, so that the breakage of the gate insulating film due to the charge in the manufacturing process of the semiconductor device can be prevented effectively.

Fifth Embodiment

In the description of the first embodiment, an nMOS is taken as an example, but a protective diode may be applied to a pMOS (p-channel type MOSFET).

[Description of Structure]

FIG. 32 is a sectional view illustrating a configuration of a semiconductor device (pMOS) of the present embodiment. Note that the semiconductor device of the present embodiment is the same as that of the first embodiment except that a conductivity type of the semiconductor region is opposite to that of the first embodiment. Therefore, detailed descriptions of the configuration are omitted.

As illustrated in FIG. 32, the pMOS of the present embodiment is formed over the main surface of the semiconductor region (semiconductor layer, SR) constituting the SOI substrate. As illustrated in (A) of FIG. 32, this pMOS has the gate electrode GE disposed via the gate insulating film GI over the n-type semiconductor region NR (semiconductor region SR) and the source region (s) and drain region (d) which are made up of the $p^+$-type semiconductor regions PP disposed in the semiconductor region (semiconductor layer, SR) on both sides of the gate electrode GE.

In addition, as illustrated in (B) of FIG. 32, the diode has the $n^+$-type semiconductor region ($n^+$-type diffusion layer) NP, the $p^+$-type semiconductor region ($p^+$-type diffusion layer) PP and the n-type semiconductor region NR therebetween. When the diode operates, the $n^+$-type semiconductor region NP serves as a cathode, and the $p^+$-type semiconductor region PP serves as an anode. An impurity concentration of the n-type semiconductor region (n-type diffusion layer) NR is lower than an impurity concentration of the $n^+$-type semiconductor region NP. Also, the $p^+$-type semiconductor region PP is provided so as to be in contact with the p-type semiconductor region (p-type diffusion layer) PR described later. An impurity concentration of the p-type semiconductor region (p-type diffusion layer) PR is lower than an impurity concentration of the $p^+$-type semiconductor region PP.

Then, over the above-mentioned n-type semiconductor region NR, the dummy gate electrode DG disposed via the gate insulating film GI is provided. The dummy gate electrode DG is formed of the same layer as the gate electrode GE. The dummy gate electrode DG is not involved in the operation of the pMOS. Namely, no gate potential is applied to the dummy gate electrode DG, and the dummy gate electrode DG is maintained in, for example, a floating state. In addition, the dummy gate electrode DG may be electrically connected (fixed) to the anode and the cathode ($p^+$-type semiconductor region PP) of the diode.

In addition, as illustrated in (C) of FIG. 32, the n-type semiconductor region NR (semiconductor region SR) below the gate electrode GE, that is, the back gate is connected to one end ($n^+$-type semiconductor region NP) of the diode. Also, the gate electrode GE is connected via the opening OA to the p-type semiconductor region PR linked to the other end ($p^+$-type semiconductor region PP) of the diode.

Figure 33:
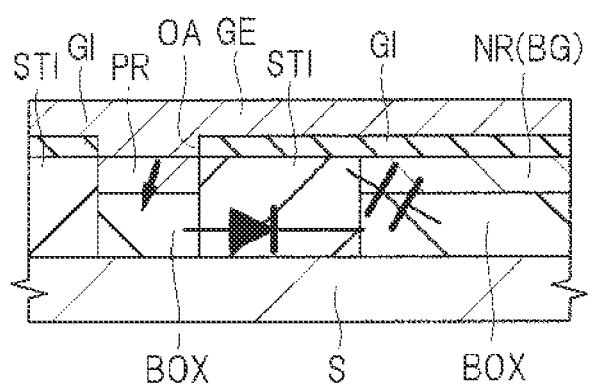
FIG. 33 is a schematic diagram illustrating a relation between a cross section of the semiconductor device (pMOS) of the fifth embodiment and the diode.

FIG. 33 is a schematic diagram illustrating a relation between a cross section of the semiconductor device (pMOS) of the present embodiment and the diode. As illustrated in FIG. 33, by providing the diode between the n-type semiconductor region NR (semiconductor region SR) below the gate electrode GE, that is, the back gate BG and the gate electrode GE, the breakage of the gate insulating film GI can be prevented in the same way as the case of the nMOS. In particular, in the semiconductor device (pMOS) of the present embodiment, since the diode function works after the formation of the gate electrode, the breakage of the gate insulating film due to the charge in the manufacturing process of the semiconductor device can be prevented effectively.

[Manufacturing Process]

Since a manufacturing method of the semiconductor device of the present embodiment is the same as that of the first embodiment except that the conductivity type of the semiconductor regions formed in each process is opposite to that of the semiconductor regions in the case of the first embodiment, descriptions thereof are omitted.

Although the case where the nMOS of the first embodiment is changed to the pMOS has been described here, the configuration of the nMOS of the second to fourth embodiments may be changed to the pMOS. More specifically, the conductivity type of each semiconductor region of the semiconductor device (nMOS) of the second to fourth embodiments may be made to be an opposite conductivity type. Namely, the thin insulating film IL of the second embodiment may be applied to the configuration of the pMOS of FIG. 32, and the defect DF of the gate insulating film GI of the third embodiment may be applied to the configuration of the pMOS of FIG. 32. Furthermore, the diode configuration of the fourth embodiment may be applied to the configuration of the pMOS of FIG. 32. In this case, an NPN type diode is used as a diode.

Also, the nMOS of the first embodiment and the pMOS of the present embodiment may be formed over the same substrate. In this way, a complementary type MOS (CMOS) made up of an nMOS and a pMOS may be formed. In a formation process of the CMOS like this, the p-type semiconductor region PR in the nMOS and the p-type semiconductor region PR in the pMOS can be formed by the same ion implantation process. In addition, the n-type semiconductor region NR in the nMOS and the n-type semiconductor region NR in the pMOS can be formed by the same ion implantation process.

Sixth Embodiment

In the first embodiment, a SOI substrate is used. Alternatively, a so-called bulk substrate may be used.

[Description of Structure]

FIG. 34 is a sectional view illustrating a configuration of a semiconductor device (nMOS) of the present embodiment. Note that the semiconductor device of the present embodiment is the same as that of the first embodiment except that a bulk substrate is used in place of a SOI substrate. Components similar to those of the first embodiment are denoted by the same reference characters, and detailed descriptions thereof are omitted.

As illustrated in FIG. 34, the nMOS of the present embodiment is formed over a main surface of a substrate S. The substrate S is, for example, a p-type single crystal silicon substrate (semiconductor substrate). In the substrate S, a p-type well PW which is a p-type semiconductor region is provided.

As illustrated in (A) of FIG. 34, this nMOS has the gate electrode GE disposed via the gate insulating film GI over the p-type well PW and the source region (s) and drain region (d) which are made up of the $n^+$-type semiconductor regions NP disposed in the p-type well PW on both sides of the gate electrode GE.

In addition, as illustrated in (B) of FIG. 34, the diode has the $n^+$-type semiconductor region ($n^+$-type diffusion layer) NP, the $p^+$-type semiconductor region ($p^+$-type diffusion layer) PP and the p-type well PW therebetween. When the diode operates, the $n^+$-type semiconductor region NP serves as a cathode, and the $p^+$-type semiconductor region PP serves as an anode. An impurity concentration of the p-type well PW is lower than an impurity concentration of the $p^+$-type semiconductor region PP. Also, the $n^+$-type semiconductor region NP is provided so as to be in contact with the n-type semiconductor region (n-type diffusion layer) NR described later.

An impurity concentration of the n-type semiconductor region (n-type diffusion layer) NR is lower than an impurity concentration of the n+-type semiconductor region NP.

Then, over the above-mentioned p-type well PW, the dummy gate electrode DG disposed via the gate insulating film GI is provided. The dummy gate electrode DG is formed of the same layer as the gate electrode GE. The dummy gate electrode DG is not involved in the operation of the nMOS. Namely, no gate potential is applied to the dummy gate electrode DG, and the dummy gate electrode DG is maintained in, for example, a floating state. In addition, the dummy gate electrode DG may be electrically connected (fixed) to the cathode (n+-type semiconductor region NP) and the anode (p+-type semiconductor region PP) of the diode.

In this way, the diode is formed by a PN junction of the n+-type semiconductor region (n+-type diffusion layer) NP on the cathode side and the p-type well PW and the p+-type semiconductor region (p+-type diffusion layer) PP on the anode side.

In addition, as illustrated in (C) of FIG. 34, the p-type well PW below the gate electrode GE, that is, the back gate is connected to one end (p+-type semiconductor region PP) of the diode. Also, the gate electrode GE is connected to the n-type semiconductor region NR linked to the other end (n+-type semiconductor region NP) of the diode.

Here, the gate insulating film GI over the n-type semiconductor region NR is removed, and the opening OA is provided. Therefore, the n-type semiconductor region NR and the gate electrode GE are connected via the opening OA.

As described above, also in the present embodiment, by providing the diode between the back gate and the gate electrode GE, the breakage of the gate insulating film GI can be prevented. In particular, in the semiconductor device (nMOS) of the present embodiment, since the diode function works after the formation of the gate electrode, the breakage of the gate insulating film due to the charge in the manufacturing process of the semiconductor device can be prevented effectively.

[Manufacturing Process]

In the manufacturing method of the semiconductor device of the present embodiment, after a bulk substrate is prepared in place of the SOI substrate in the case of the first embodiment and the element isolation region STI is formed (see FIG. 8), the p-type well PW is formed in the active region. Thereafter, the nMOS and the diode are formed in the same way as the first embodiment.

Although the case where the nMOS of the first embodiment is formed over the bulk substrate has been described here, the nMOS of the second to fourth embodiments may be formed over the bulk substrate. In addition, the pMOS of the fifth embodiment may be formed over the bulk substrate.

Seventh Embodiment

The source region s and the drain region d of the nMOS of the first embodiment may be made to have a LDD structure.

[Description of Structure]

Figure 35:
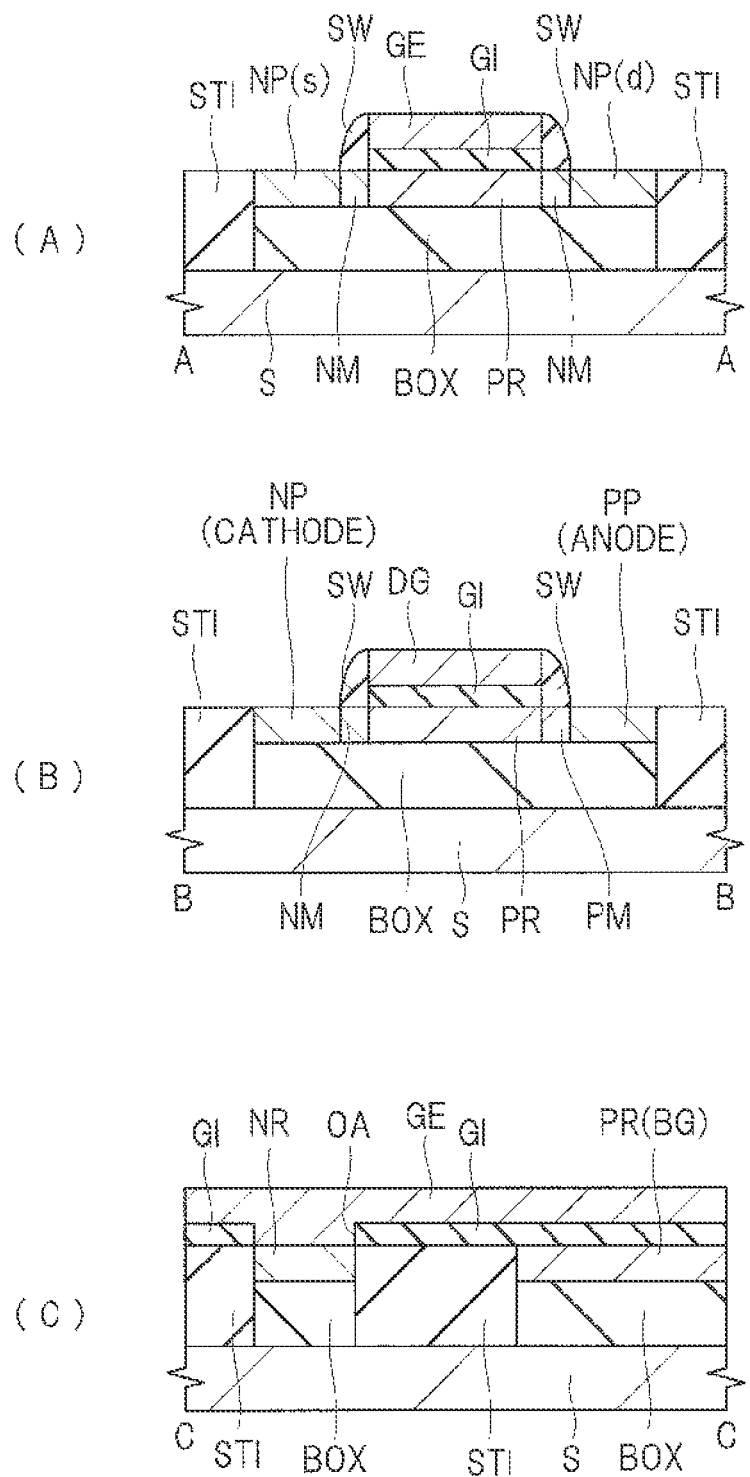
FIG. 35 is a sectional view illustrating a configuration of a semiconductor device (nMOS) of the seventh embodiment.

FIG. 35 is a sectional view illustrating a configuration of a semiconductor device (nMOS) of the present embodiment. Note that the semiconductor device of the present embodiment is the same as that of the first embodiment except that a sidewall film (sidewall insulating film) SW is provided over the side walls of the gate electrode GE and the dummy gate electrode DG and an n−-type semiconductor region (n−-type diffusion layer) NM or a p−-type semiconductor region (p−-type diffusion layer) PM is formed below the sidewall film SW.

As illustrated in FIG. 35, the nMOS of the present embodiment is formed over the main surface of the semiconductor region (semiconductor layer, SR) constituting the SOI substrate.

As illustrated in (A) of FIG. 35, this nMOS has the gate electrode GE disposed via the gate insulating film GI over the p-type semiconductor region PR (semiconductor region SR) and the source region (s) and drain region (d) which are disposed in the semiconductor region (semiconductor layer, SR) on both sides of the gate electrode GE. The source region (s) and the drain region (d) have the LDD structure, and include the n−-type semiconductor region NM and n+-type semiconductor region NP. The n−-type semiconductor region NM is formed in a self-alignment manner with respect to the side wall of the gate electrode GE. Also, the n+-type semiconductor region NP is formed in a self-alignment manner with respect to the side surface of the sidewall film SW formed over the side wall of the gate electrode GE. An impurity concentration of this n+-type semiconductor region NP is higher than that of the n−-type semiconductor region NM. Note that an impurity concentration of the n−-type semiconductor region NM is lower than that of the n-type semiconductor region NR described later.

In addition, as illustrated in (B) of FIG. 35, the diode has the n+-type semiconductor region (n+-type diffusion layer) NP, the p+-type semiconductor region (p+-type diffusion layer) PP and the p-type semiconductor region PR therebetween. In this case, however, on the dummy gate electrode DG side of the n+-type semiconductor region NP, the n−-type semiconductor region NM is provided, and on the dummy gate electrode DG side of the p+-type semiconductor region PP, the p−-type semiconductor region PM is provided. In other words, the n−-type semiconductor region NM is provided below the sidewall film SW over the side wall of the dummy gate electrode DG on the n+-type semiconductor region NP side, and the p−-type semiconductor region PM is provided below the sidewall film SW over the side wall of the dummy gate electrode DG on the p+-type semiconductor region PP side.

When the diode operates, the n+-type semiconductor region NP serves as a cathode, and the p+-type semiconductor region PP serves as an anode. An impurity concentration of the p-type semiconductor region (p-type diffusion layer) PR is lower than an impurity concentration of the p+-type semiconductor region PP. Also, the n+-type semiconductor region NP is provided so as to be in contact with the n-type semiconductor region (n-type diffusion layer) NR described later.

The dummy gate electrode DG is disposed via the gate insulating film GI over the p-type semiconductor region PR. The dummy gate electrode DG is formed of the same layer as the gate electrode GE. The dummy gate electrode DG is not involved in the operation of the nMOS. Namely, no gate potential is applied to the dummy gate electrode DG, and the dummy gate electrode DG is maintained in, for example, a floating state. In addition, the dummy gate electrode DG may be electrically connected (fixed) to the cathode (n+-type semiconductor region NP) and the anode (p+-type semiconductor region PP) of the diode.

In this way, the diode is formed by a PN junction of the n+-type semiconductor region (n+-type diffusion layer) NP on the cathode side and the p-type semiconductor region PR and the p+-type semiconductor region (p+-type diffusion layer) PP on the anode side.

In addition, as illustrated in (C) of FIG. 35, the p-type semiconductor region PR (semiconductor region SR) below the gate electrode GE, that is, the back gate is connected to one end (p+-type semiconductor region PP) of the diode, and the gate electrode GE is connected to the n-type semiconductor region NR linked to the other end (n⁺-type semiconductor region NP) of the diode.

Also in the present embodiment, by the diode between the back gate and the gate electrode GE, the breakage of the gate insulating film GI can be prevented. In particular, in the semiconductor device (nMOS) of the present embodiment, since the diode function works after the formation of the gate electrode, the breakage of the gate insulating film due to the charge in the manufacturing process of the semiconductor device can be prevented effectively.

[Manufacturing Process]

Subsequently, a manufacturing process of the semiconductor device of the present embodiment will be described. Note that the detailed descriptions of the same process as that of the first embodiment are omitted.

First, as illustrated in FIG. 12 of the first embodiment, after the gate electrode GE and the dummy gate electrode DG are formed, the n⁻-type semiconductor region NM or the p⁻-type semiconductor region PM is formed by the ion implantation method. More specifically, the n⁻-type semiconductor region NM is formed on both sides of the gate portion of the gate electrode GE extending along the X direction in the region 1A. Here, in the region 2A, the n⁻-type semiconductor region NM is formed also in one region on the n-type semiconductor region NR side (upper side in FIG. 13) out of the regions on both sides of the dummy gate electrode DG. Furthermore, in the region 2A, the p⁻-type semiconductor region PM is formed in one region on a side reverse to the n-type semiconductor region NR side (lower side in FIG. 13) out of the regions on both sides of the dummy gate electrode DG, in other words, in the region connected to the back gate of the nMOS (see FIG. 1).

Subsequently, the sidewall film SW is formed over the side walls of the gate electrode GE and the dummy gate electrode DG. For example, after an insulating film made up of a silicon oxide film is deposited over the SOI substrate by the CVD method or the like, anisotropic etching is applied, and the insulating film is left as the sidewall film SW over the side walls of the gate electrode GE and the dummy gate electrode DG.

Subsequently, in the semiconductor region on both sides of an integrated part of the gate electrode GE and the sidewall films SW and an integrated part of the dummy gate electrode DG and the sidewall films SW, the n⁺-type semiconductor region NP or the p⁺-type semiconductor region PP is formed. More specifically, the n⁺-type semiconductor region NP is formed on both sides of the gate portion of the gate electrode GE extending along the X direction in the region 1A. Here, in the region 2A, the n⁺-type semiconductor region NP is formed also in one region on the n-type semiconductor region NR side (upper side in FIG. 13) out of the regions on both sides of the dummy gate electrode DG. Furthermore, in the region 2A, the p⁺-type semiconductor region PP is formed in one region on a side reverse to the n-type semiconductor region NR side (lower side in FIG. 13) out of the regions on both sides of the dummy gate electrode DG, in other words, in the region connected to the back gate of the nMOS (see FIG. 1).

By the process above, the source region s and the drain region d (n⁻-type semiconductor region NM and n⁺-type semiconductor region NP) of the LDD structure of the nMOS can be formed, and the n⁻-type semiconductor region NM, the n⁺-type semiconductor region NP, the p⁻-type semiconductor region PM and the p⁺-type semiconductor region (p⁺-type diffusion layer) PP constituting the diode can be formed.

Then, an interlayer insulating film, a plug (connection part), wirings and others are formed over the nMOS and diode in the same way as the first embodiment.

Here, the sidewall film SW, the source region s and drain region d of the LDD structure and others are applied to the nMOS of the first embodiment, but these configurations may be applied to the nMOS of the second to fourth embodiments and the pMOS of the fifth embodiment.

Eighth Embodiment

Although the nMOS (FIG. 1) has only one gate electrode GE in the description of the first embodiment, two or more gate electrodes GE may be provided.

Figure 36:
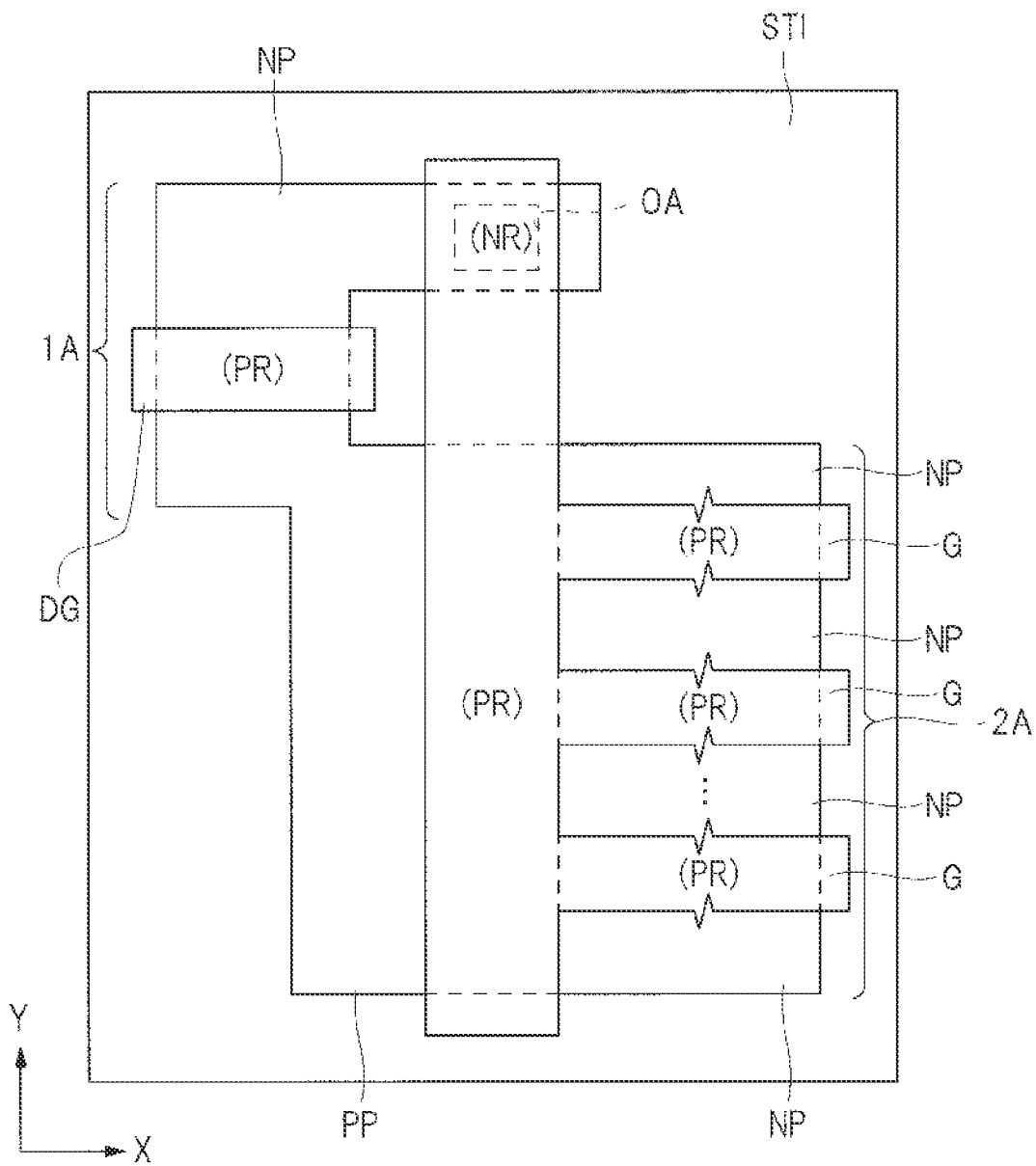
FIG. 36 is a plan view illustrating a configuration of a semiconductor device (nMOS) of the eighth embodiment.

FIG. 36 is a plan view illustrating a configuration of a semiconductor device (nMOS) of the present embodiment. The semiconductor device of the present embodiment is the same as that of the first embodiment except the number of gate electrodes GE.

As illustrated in FIG. 36, in the nMOS of the present embodiment, a plurality of gate portions extending along the X direction from the gate leading portion extending in the Y direction are provided in the region 1A. A gate width of one gate portion is, for example, approximately 10 to 50 μm, and several hundreds of gate portions are used in some cases. In this way, in the semiconductor device having a large formation region of the gate electrode GE, a charge tends to be accumulated, and the protective diode described in the first embodiment is effectively applied.

Although an example where a plurality of gate portions are adopted to the nMOS of the first embodiment has been described here, the plurality of gate portions may be adopted to the nMOS of the second to fourth embodiments and the pMOS of the fifth embodiment.

In the foregoing, the invention made by the inventor of the present invention has been concretely described based on the embodiments. However, it is needless to say that the present invention is not limited to the foregoing embodiments and various modifications and alterations can be made within the scope of the present invention.

[Note 1]

A manufacturing method of a semiconductor device, including the steps of:
  (a) forming semiconductor regions of a first conductivity type or a second conductivity type that is opposite to the first conductivity type in a first region, a second region and a third region in the second region of a semiconductor layer, a first semiconductor region of the first conductivity type being formed in the third region, and a second semiconductor region of the second conductivity type being formed in the first region and in the second region except the third region;
  (b) forming a first insulating film over the first region and the second region;
  (c) forming a defect in the first insulating film over the third region;
  (d) forming a first electrode extending from the first insulating film of the first region onto the third region; and
  (e) forming source and drain regions of the first conductivity type on both sides of the first electrode of the first region, forming a third semiconductor region of the first conductivity type in the second region so as to be connected to the first semiconductor region, and forming a fourth semiconductor region of the second conductivity type so as to be connected to the second semiconductor region below the first electrode.

[Note 2]

A manufacturing method of a semiconductor device, including the steps of:
(a) forming semiconductor regions of a first conductivity type or a second conductivity type that is opposite to the first conductivity type in a first region, a second region and a third region in the second region of a semiconductor layer, a first semiconductor region of the first conductivity type being formed in the second region except the third region, a second semiconductor region of the second conductivity type being formed in the first region, and a third semiconductor region of the second conductivity type being formed in the third region;
(b) forming a first insulating film over the first region and the second region;
(c) removing the first insulating film over the third region, thereby forming an opening;
(d) forming a first electrode extending from the first insulating film of the first region onto the opening; and
(e) forming source and drain regions of the first conductivity type on both sides of the first electrode of the first region, forming a fourth semiconductor region of the second conductivity type in the second region so as to be connected to the third semiconductor region, and forming a fifth semiconductor region of the second conductivity type so as to be connected to the second semiconductor region below the first electrode.

[Note 3]

The manufacturing method of a semiconductor device according to Note 2, wherein, in the step (d), the first electrode extending from the first insulating film of the first region onto the third region is formed, and a second electrode is formed over the first insulating film of the second region, and in the step (e), source and drain regions of the second conductivity type are formed on both sides of the first electrode of the first region, the fourth semiconductor region of the second conductivity type is formed on one side of the second electrode of the second region so as to be connected to the third semiconductor region, and the fifth semiconductor region of the second conductivity type is formed on the other side of the second electrode of the second region so as to be connected to the second semiconductor region below the first electrode.

What is claimed is:

1. A semiconductor device, comprising:
a MOSFET formed in a first region of a semiconductor layer; and
a diode formed in a second region of the semiconductor layer,
wherein the MOSFET includes: a first electrode formed via a first insulating film over the semiconductor layer; and source and drain regions of a first conductivity type formed in the semiconductor layer of the first region on both sides of the first electrode,
the diode includes: a first semiconductor region of the first conductivity type formed in the semiconductor layer of the second region; a second semiconductor region of a second conductivity type that is opposite to the first conductivity type, the second semiconductor region being formed so as to have a PN junction with the first semiconductor region in the semiconductor layer of the second region; and a third semiconductor region of the first conductivity type formed so as to be connected to the first semiconductor region in the semiconductor layer of the second region,
the second semiconductor region is formed so as to be connected to the semiconductor layer below the first electrode, and
the first electrode extends onto the third semiconductor region and is connected to the first semiconductor region via the third semiconductor region.

2. The semiconductor device according to claim 1,
wherein the first region and the second region are disposed in the same active region surrounded by an element isolation region.

3. The semiconductor device according to claim 2,
wherein the first insulating film has an opening over the third semiconductor region.

4. The semiconductor device according to claim 1, further comprising:
a second electrode formed via a second insulating film over the semiconductor layer of the second region; and
a fourth semiconductor region formed below the second electrode,
wherein the fourth semiconductor region is disposed between the first semiconductor region and the second semiconductor region.

5. The semiconductor device according to claim 4,
wherein the second electrode is in a floating state or is electrically connected to the first semiconductor region and the second semiconductor region.

6. The semiconductor device according to claim 4, further comprising:
a sidewall insulating film over each side wall of the first electrode and the second electrode.

7. The semiconductor device according to claim 1,
wherein the semiconductor layer is disposed via an insulating layer over a substrate.

8. The semiconductor device according to claim 1,
wherein the semiconductor layer is a semiconductor substrate.

9. The semiconductor device according to claim 3, further comprising:
a third insulating film over the third semiconductor region in the opening,
wherein a film thickness of the third insulating film is smaller than a film thickness of the first insulating film.

10. The semiconductor device according to claim 2,
wherein the first insulating film is disposed below the first electrode, and the first insulating film located between the first electrode and the third semiconductor region has a defect.

11. A semiconductor device, comprising:
a MOSFET formed in a first region of a semiconductor layer; and
a diode formed in a second region of the semiconductor layer, wherein the MOSFET includes: a first electrode formed via a first insulating film over the semiconductor layer; and source and drain regions of a first conductivity type formed in the semiconductor layer of the first region on both sides of the first electrode,
the diode includes: a first semiconductor region of a second conductivity type that is opposite to the first conductivity type, the first semiconductor region being formed in the semiconductor layer of the second region; a second semiconductor region of the first conductivity type formed so as to have a PN junction with the first semiconductor region in the semiconductor layer of the second region; and a third semiconductor region of the second conductivity type formed so as to have a PN junction with the second semiconductor region in the semiconductor layer of the second region,
the third semiconductor region is formed so as to be connected to the semiconductor layer below the first electrode, and the first electrode extends onto the first semiconductor region and is connected to the first semiconductor region.

12. The semiconductor device according to claim 11, wherein the first region and the second region are disposed in the same active region surrounded by an element isolation region.

13. The semiconductor device according to claim 12, wherein the first insulating film has an opening and the first electrode is connected to the first semiconductor region via the opening.

14. The semiconductor device according to claim 11, further comprising:
a second electrode formed via a second insulating film over the second semiconductor region.

15. The semiconductor device according to claim 14, wherein the second electrode is in a floating state or is electrically connected to the first semiconductor region and the second semiconductor region.

16. A manufacturing method of a semiconductor device, comprising the steps of:
(a) forming semiconductor regions of a first conductivity type or a second conductivity type that is opposite to the first conductivity type in a first region, a second region and a third region in the second region of a semiconductor layer, a first semiconductor region of the first conductivity type being formed in the third region, and a second semiconductor region of the second conductivity type being formed in the first region and in the second region except the third region;
(b) forming a first insulating film over the first region and the second region;
(c) removing the first insulating film over the third region, thereby forming an opening;
(d) forming a first electrode extending from the first insulating film of the first region onto the third region; and
(e) forming source and drain regions of the first conductivity type on both sides of the first electrode of the first region, forming a third semiconductor region of the first conductivity type in the second region so as to be connected to the first semiconductor region, and forming a fourth semiconductor region of the second conductivity type so as to be connected to the second semiconductor region below the first electrode.

17. The manufacturing method of a semiconductor device according to claim 16,
wherein, in the step (d), the first electrode extending from the first insulating film of the first region onto the third region is formed, and a second electrode is formed over the first insulating film of the second region, and
in the step (e), source and drain regions of the second conductivity type are formed on both sides of the first electrode of the first region, the third semiconductor region of the first conductivity type is formed on one side of the second electrode of the second region so as to be connected to the first semiconductor region, and the fourth semiconductor region of the second conductivity type is formed on the other side of the second electrode of the second region so as to be connected to the second semiconductor region below the first electrode.

18. The manufacturing method of a semiconductor device according to claim 16, further comprising the step of:
forming a third insulating film having a film thickness smaller than a film thickness of the first insulating film over the first semiconductor region in the opening after the step (c) and before the step (d).

* * * * *